US010557910B2

(12) United States Patent
Sueoka

(10) Patent No.: US 10,557,910 B2
(45) Date of Patent: Feb. 11, 2020

(54) MAGNETIC RESONANCE IMAGING APPARATUS

(71) Applicant: TOSHIBA MEDICAL SYSTEMS CORPORATION, Otawara-shi (JP)

(72) Inventor: Kazuhiro Sueoka, Otawara (JP)

(73) Assignee: Canon Medical Systems Corporation, Otawara-shi (JP)

( * ) Notice: Subject to any disclaimer, the term of this patent is extended or adjusted under 35 U.S.C. 154(b) by 523 days.

(21) Appl. No.: 15/289,296

(22) Filed: Oct. 10, 2016

(65) Prior Publication Data

US 2017/0108568 A1    Apr. 20, 2017

(30) Foreign Application Priority Data

Oct. 19, 2015    (JP) .................. 2015-205876

(51) Int. Cl.
*G01V 3/00* (2006.01)
*G01R 33/563* (2006.01)
*G01R 33/483* (2006.01)
*G01R 33/56* (2006.01)

(52) U.S. Cl.
CPC ..... *G01R 33/5635* (2013.01); *G01R 33/4833* (2013.01); *G01R 33/5608* (2013.01); *G01R 33/56308* (2013.01)

(58) Field of Classification Search
CPC ............................... G01R 33/5635
USPC .......................... 324/306, 307, 309
See application file for complete search history.

(56) References Cited

U.S. PATENT DOCUMENTS

| 2016/0018501 A1 | 1/2016 | Kimura |
| 2017/0219672 A1* | 8/2017 | Miyazaki ........... G01R 33/4816 |
| 2017/0254868 A1* | 9/2017 | Kimura ............ G01R 33/56308 |
| 2018/0095153 A1* | 4/2018 | Kimura ................. G01R 33/54 |

FOREIGN PATENT DOCUMENTS

JP    2014-210175 A    11/2014

* cited by examiner

*Primary Examiner* — Louis M Arana
(74) *Attorney, Agent, or Firm* — Oblon, McClelland, Maier & Neustadt, L.L.P.

(57) ABSTRACT

An MRI apparatus includes a processing circuitry that executes a pulse sequence by which a data acquiring process is repeatedly performed multiple times where data is acquired every time each of waiting periods has elapsed since a tag pulse used for labeling a fluid flowing into an image taking region of a patient is applied, that acquires, at at least one time among the multiple times, data corresponding to one region by using a three-dimensional sequence, out of three-dimensional data acquired while being divided into regions, during each of the data acquiring processes corresponding to a first waiting period among the waiting periods, and that acquires data allocated to the one time by using a two-dimensional sequence, out of a slice of two-dimensional data corresponding to the entire three-dimensional data, during each of the data acquiring processes corresponding to a second waiting period different from the first waiting period.

9 Claims, 18 Drawing Sheets

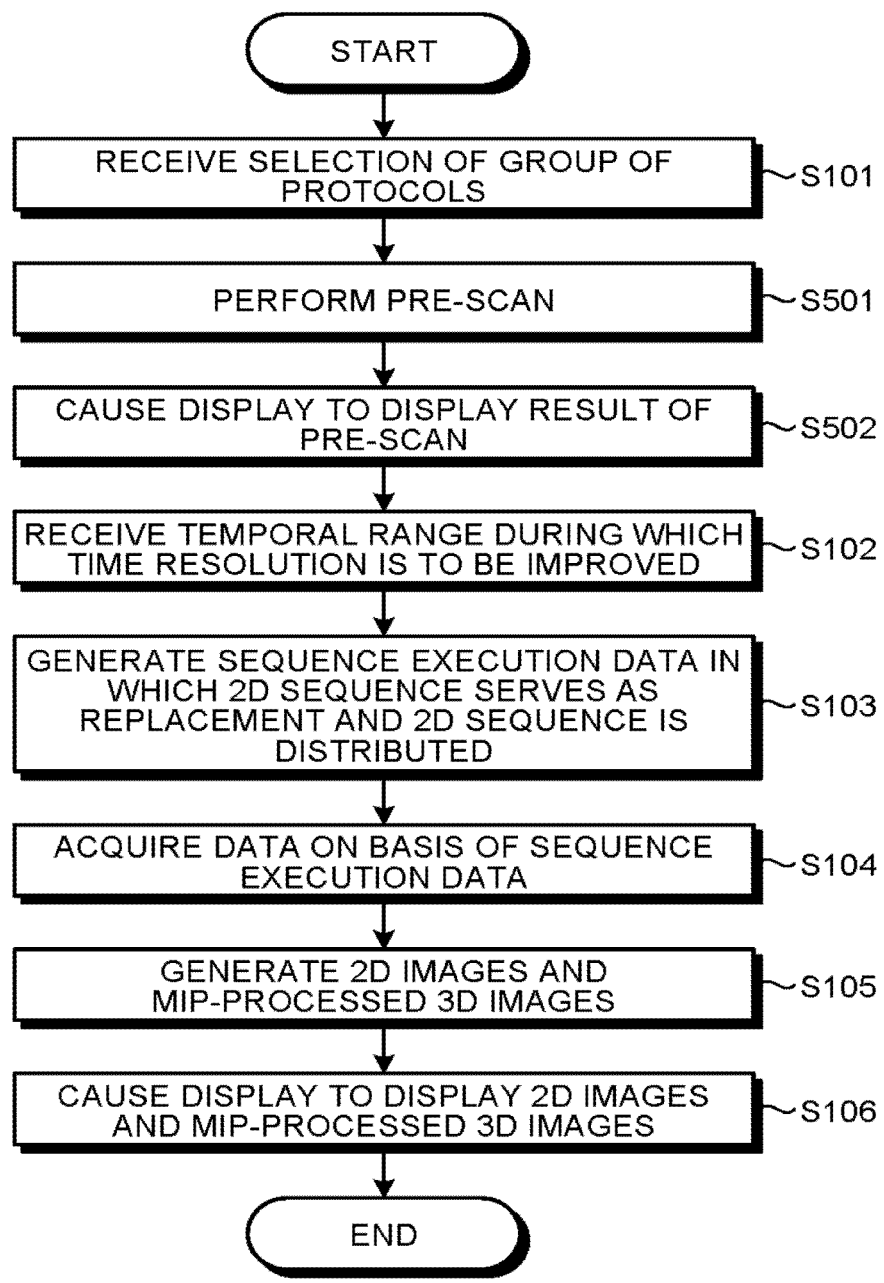

MAGNETIC RESONANCE IMAGING APPARATUS

CROSS-REFERENCE TO RELATED APPLICATIONS

This application is based upon and claims the benefit of priority from Japanese Patent Application No. 2015-205876, filed on Oct. 19, 2015; the entire contents of which are incorporated herein by reference.

FIELD

Embodiments described herein relate generally to a magnetic resonance imaging apparatus.

BACKGROUND

A Magnetic Resonance Imaging (MRI) apparatus is configured to magnetically excite a nuclear spin in an examined subject (hereinafter, "patient") placed in a magnetostatic field by using a Radio Frequency (RF) pulse having a Larmor frequency and to reconstruct an image from Magnetic Resonance (MR) signals generated due to the excitation.

BRIEF DESCRIPTION OF THE DRAWINGS

FIG. 18 is a flowchart illustrating a processing procedure according to a third modification example.

DETAILED DESCRIPTION

A magnetic resonance imaging apparatus according to an embodiment includes processing circuitry. The processing circuitry is configured to execute a pulse sequence by which a data acquiring process is repeatedly performed a predetermined number of times, the data acquiring process being configured to acquire data every time each of a plurality of waiting periods has elapsed since a tag pulse used for labeling a fluid flowing into an image taking region of a patient is applied. At at least one time among the predetermined number of times, the processing circuitry acquires a piece of data corresponding to one region by using a three-dimensional sequence, out of three-dimensional data that is acquired while being divided into a plurality of regions, during each of one or more of the data acquiring processes corresponding to a first waiting period among the plurality of waiting periods, and the processing circuitry acquires a piece of data allocated to the one time by using a two-dimensional sequence, out of a slice of two-dimensional data corresponding to an entirety of the three-dimensional data, during each of one or more of the data acquiring processes corresponding to a second waiting period that is different from the first waiting period.

Exemplary embodiments and modification examples of a magnetic resonance imaging apparatus (hereinafter, "MRI" apparatus, as appropriate) will be explained below, with reference to the accompanying drawings. Further, it is possible to combine together, as appropriate, any of the embodiments and the modification examples described below.

An Embodiment

Figure 1:
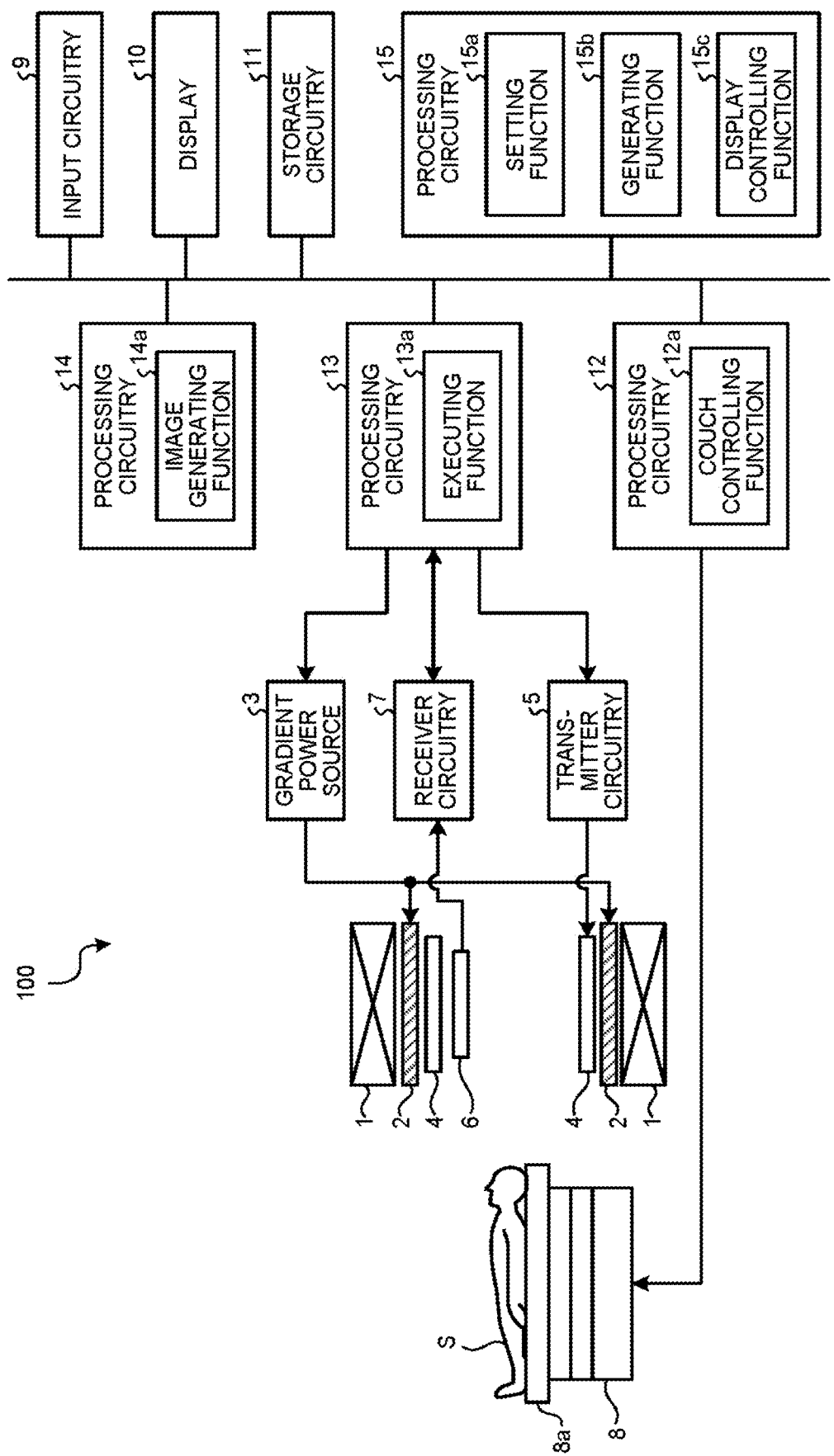
FIG. 1 is a functional block diagram illustrating a configuration of an MRI apparatus according to an embodiment.

FIG. 1 is a functional block diagram illustrating a configuration of an MRI apparatus 100 according to an embodiment. As illustrated in FIG. 1, the MRI apparatus 100 includes a magnetostatic field magnet 1, a gradient coil 2, a gradient power source 3, a transmitter coil 4, transmitter circuitry 5, a receiver coil 6, receiver circuitry 7, a couch 8, input circuitry 9, a display 10, storage circuitry 11, and processing circuitry 12 to 15. The MRI apparatus 100 does not include a patient S (e.g., a human body) illustrated in FIG. 1. Further, the configuration illustrated in FIG. 1 is merely an example.

The magnetostatic field magnet 1 is formed to have a hollow and substantially circular cylindrical shape (which may have an oval cross-section orthogonal to the central axis thereof) and is configured to generate a magnetostatic field in an image taking space formed on the inner circumferential side thereof. For example, the magnetostatic field magnet 1 may be realized with a permanent magnet, a superconductive magnet, or the like.

The gradient coil 2 is formed to have a hollow and substantially circular cylindrical shape (which may have an oval cross-section orthogonal to the central axis thereof) and is disposed on the inner circumferential side of the magnetostatic field magnet 1. The gradient coil 2 includes three coils configured to generate gradient magnetic fields along x-, y-, and z-axes, respectively, that are orthogonal to one another. In this situation, the x-axis, the y-axis, and the z-axis structure an apparatus coordinate system unique to the MRI apparatus 100. For example, the x-axis direction is set in the vertical direction, whereas the y-axis direction is set in the horizontal direction. Further, the z-axis direction is set so as to be the same as the direction of a magnetic flux in the magnetostatic field generated by the magnetostatic field magnet 1.

By individually supplying an electric current to each of the three coils included in the gradient coil 2, the gradient power source 3 is configured to cause gradient magnetic fields to be generated along the x-, y-, and z-axes, in the image taking space. The gradient power source 3 is able to cause the gradient magnetic fields to be generated along a read-out direction, a phase-encoding direction, and a slice direction that are orthogonal to one another, by generating the gradient magnetic fields along the x-, y-, and z-axes. In this situation, the axes extending along the read-out direction, the phase-encoding direction, and the slice direction structure a logical coordinate system used for defining slice regions or a volume region serving as a target of an image taking process. In the following sections, the gradient magnetic field generated along the read-out direction will be referred to as a read-out gradient magnetic field; the gradient magnetic field generated along the phase-encoding direction will be referred to as a phase-encoding gradient magnetic field; and the gradient magnetic field generated along the slice direction will be referred to as a slice gradient magnetic field.

The gradient magnetic fields are superimposed on the magnetostatic field generated by the magnetostatic field magnet 1 and are used for appending spatial position information to magnetic resonance (MR) signals. More specifically, the read-out gradient magnetic field appends position information along the read-out direction to an MR signal, by varying the frequency of the MR signal in accordance with the position in the read-out direction. Further, the phase-encoding gradient magnetic field appends position information in the phase-encoding direction to an MR signal, by varying the phase of the MR signal along the phase-encoding direction. Further, when an image taking region is represented by slice regions, the slice gradient magnetic field is used for determining the orientations, the thicknesses, and the quantity of the slice regions. In contrast, when the image taking region is represented by a volume region, the slice gradient magnetic field appends position information along the slice direction to an MR signal, by varying the phase of the MR signal in accordance with the position in the slice direction.

The transmitter coil 4 is formed to have a hollow and substantially circular cylindrical shape (which may have an oval cross-section orthogonal to the central axis thereof) and is disposed on the inside of the gradient coil 2. The transmitter coil 4 is configured to apply a Radio Frequency (RF) pulse output from the transmitter circuitry 5 to the image taking space.

The transmitter circuitry 5 is configured to output the RF pulse corresponding to a Larmor frequency to the transmitter coil 4. For example, the transmitter circuitry 5 includes oscillation circuitry, phase selecting circuitry, frequency converting circuitry, amplitude modulating circuitry, and RF amplifying circuitry. The oscillation circuitry is configured to generate an RF pulse having a resonant frequency unique to a targeted atomic nucleus placed in the magnetostatic field. The phase selecting circuitry is configured to select a phase of the RF pulse output from the oscillation circuitry. The frequency converting circuitry is configured to convert the frequency of the RF pulse output from the phase selecting circuitry. The amplitude modulating circuitry is configured to modulate the amplitude of the RF pulse output from the frequency converting circuitry, according to a sinc function, for example. The RF amplifying circuitry is configured to amplify the RF pulse output from the amplitude modulating circuitry and to output the amplified RF pulse to the transmitter coil 4.

The receiver coil 6 is disposed on the inside of the gradient coil 2 and is configured to receive the MR signals emitted from the patient S due to an influence of the RF pulse. When having received the MR signals, the receiver coil 6 outputs the received MR signals to the receiver circuitry 7.

The receiver circuitry 7 is configured to generate MR signal data on the basis of the MR signals output from the receiver coil 6 and to output the generated MR signal data to the processing circuitry 13. For example, the receiver circuitry 7 includes selecting circuitry, pre-amplifying circuitry, phase detecting circuitry, and analog/digital converting circuitry. The selecting circuitry is configured to selectively receive an input of the MR signals output from the receiver coil 6. The pre-amplifying circuitry is configured to amplify the MR signals output from the selecting circuitry. The phase detecting circuitry is configured to detect the phases of the MR signals output from the pre-amplifying circuitry. The analog/digital converting circuitry is configured to generate the MR signal data by converting analog signals output from the phase detector into digital signals and to output the generated MR signal data to the processing circuitry 13.

In the present example, the situation in which the transmitter coil 4 applies the RF pulse so that the receiver coil 6 receives the MR signals is explained; however, possible embodiments of the transmitter coil and the receiver coil are not limited to this example. For instance, the transmitter coil 4 may further have a receiving function to receive the MR signals. Further, the receiver coil 6 may further have a transmitting function to apply an RF magnetic field. When the transmitter coil 4 has the receiving function, the receiver circuitry 7 generates MR signal data also from the MR signals received by the transmitter coil 4. Further, when the receiver coil 6 has the transmitting function, the transmitter circuitry 5 outputs an RF pulse also to the receiver coil 6.

The couch 8 includes a couchtop 8a on which the patient S is placed. When an image taking process is performed on the patient S, the couchtop 8a is inserted into the image taking space formed on the inside of the magnetostatic field magnet 1 and the gradient coil 2. For example, the couch 8 is installed in such a manner that the longitudinal direction thereof extends parallel to the central axis of the magnetostatic field magnet 1.

The input circuitry 9 is configured to receive operations to input various types of instructions and various types of information from an operator such as a medical doctor or a radiologic technologist. For example, the input circuitry 9 is realized with a trackball, a switch button, a mouse, a keyboard, a touch panel, and/or the like. The input circuitry 9 is connected to the processing circuitry 15 and is configured to convert each of the input operations received from the operator into an electrical signal and to output the electrical signal to the processing circuitry 15.

The display 10 is configured to display various types of information and various types of images. For example, the display 10 is realized with a liquid crystal monitor, a Cathode Ray Tube (CRT) monitor, a touch panel, or the like. The display 10 is connected to the processing circuitry 15 and is configured to convert data of the various types of information and the various types of images sent thereto from the processing circuitry 15, into display-purpose electrical signals and to output the display-purpose electrical signals.

The storage circuitry 11 is configured to store various types of data therein. For example, the storage circuitry 11 stores therein the MR signal data and image data for each patient S. For example, the storage circuitry 11 is realized with a semiconductor memory device such as a Random Access Memory (RAM), a flash memory, or the like, or a hard disk, an optical disk, or the like.

The processing circuitry 12 includes a couch controlling function 12a. For example, the processing circuitry 12 is realized with a processor. The couch controlling function 12a is connected to the couch 8 and is configured to control operations of the couch 8 by outputting a control-purpose electrical signal to the couch 8. For example, the couch controlling function 12a receives, via the input circuitry 9, an instruction to move the couchtop 8a in a longitudinal direction, an up-and-down direction, or a left-and-right direction from the operator and operates a driving mechanism for the couchtop 8a included in the couch 8 so as to move the couchtop 8a according to the received instruction.

The processing circuitry 13 includes an executing function 13a. For example, the processing circuitry 13 is realized with a processor. The executing function 13a is configured to execute various types of pulse sequences. More specifically, the executing function 13a executes the various types of pulse sequences by driving the gradient power source 3, the transmitter circuitry 5, and the receiver circuitry 7 on the basis of sequence execution data output from the processing circuitry 15. The executing function 13a is an example of an executing unit.

In this situation, the sequence execution data is information that defines a pulse sequence indicating a procedure performed to acquire the MR signal data. More specifically, the sequence execution data is information that defines: the timing with which the electric current is to be supplied from the gradient power source 3 to the gradient coil 2 and the intensity of the electric current to be supplied; the intensity of an RF pulse current to be supplied from the transmitter circuitry 5 to the transmitter coil 4 and the timing with which the RF pulse current is to be supplied; the timing with which the MR signals are to be detected by the receiver circuitry 7, and the like.

Further, as a result of executing the various types of pulse sequences, the executing function 13a is configured to receive the MR signal data from the receiver circuitry 7 and to store the received MR signal data into the storage circuitry 11. In this situation, a set made up of pieces of MR signal data received by the executing function 13a is stored, into the storage circuitry 11, as data structuring a k-space, by being arranged either two-dimensionally or three-dimensionally in accordance with the position information appended by the read-out gradient magnetic field, the phase-encoding gradient magnetic field, and the slice gradient magnetic field described above. In other words, the executing function 13a acquires the data structuring the k-space on the basis of the sequence execution data.

The processing circuitry 14 includes an image generating function 14a. For example, the processing circuitry 14 is realized with a processor. The image generating function 14a is configured to generate various types of images such as a two-dimensional (2D) image or a three-dimensional (3D) image, on the basis of the MR signal data stored in the storage circuitry 11. More specifically, the image generating function 14a generates the various types of images by reading the MR signal data stored in the storage circuitry 11 by the executing function 13a and performing a post-processing process, i.e., a reconstructing process such as a Fourier transform on the read MR signal data. Further, the image generating function 14a is configured to store image data of the generated images into the storage circuitry 11. The term "2D" denotes two-dimensional, whereas the term "3D" denotes three-dimensional. The image generating function 14a is an example of an image generating unit.

The processing circuitry 15 is configured to exercise overall control of the MRI apparatus 100 by controlling constituent elements included in the MRI apparatus 100. For example, the processing circuitry 15 is realized with a processor. For example, the processing circuitry 15 is configured to receive, via the input circuitry 9, inputs of various types of parameters related to a pulse sequence from the operator and to generate the sequence execution data on the basis of the received parameters. After that, by transmitting the generated sequence execution data to the processing circuitry 13, the processing circuitry 15 is configured to execute the various types of pulse sequences. Further, for example, the processing circuitry 15 is configured to read the image data of an image requested by the operator from the storage circuitry 11 and to output the read image to the display 10.

The exemplary configuration of the MRI apparatus 100 according to the present embodiment has thus been explained.

In the following sections, for instance, an example will be explained in which the MRI apparatus performs an image taking process by implementing an image taking method by which data is acquired every time a different one of a plurality of Inversion Time periods (hereinafter, "TI periods") has elapsed since a tag pulse is applied, so as to acquire a plurality of pieces of data corresponding to the plurality of TI periods, respectively. This image taking method is called a Dynamic Arterial Spin Labeling (ASL) Magnetic Resonance Angiography (MRA) method. When a three-dimensional image is taken, the image taking method may be referred to as a 3D Dynamic ASL MRA method. Further, the TI periods may be referred to as waiting periods. Each of the TI periods denotes a time period from the time when a tag pulse is applied to a time when an MR signal is acquired (e.g., a time when the MR signal is acquired in the vicinity of the center of the k-space). Further, the tag pulse may be referred to as an Inversion Recovery (IR) pulse. Further, the image taking method by which pieces of data are acquired while varying the TI periods after a tag pulse is applied, i.e., a piece of data is acquired in each of the plurality of TI periods after the single tag pulse is applied is called a Single-Tag Multi-TI (ST-MI) method. The 3D Dynamic ASL MRA method is an example of ASL methods.

An example in which an image taking process is performed by implementing the 3D Dynamic ASL MRA method will be explained, with reference to FIGS. 2 to 4.

Figure 2:
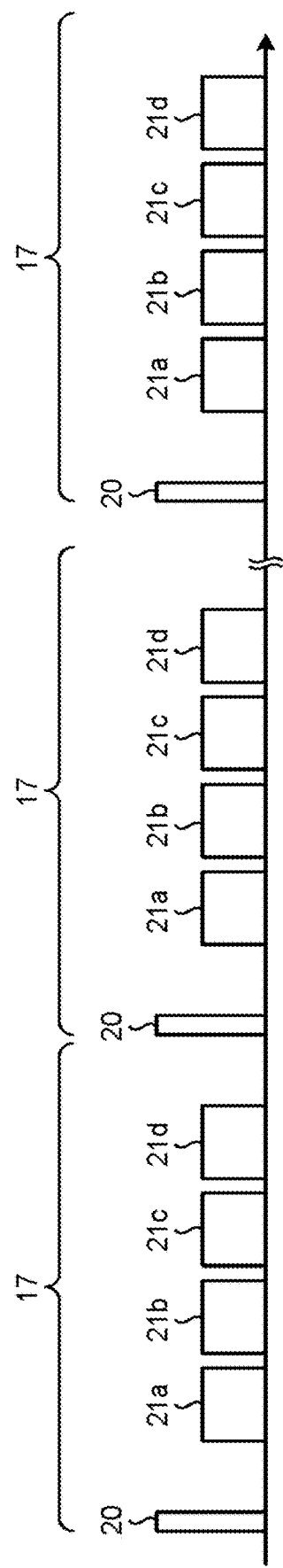
FIG. 2 is a drawing for explaining an example in which an image taking process is performed by implementing a three-dimensional (3D) Dynamic Arterial Spin Labeling (ASL) Magnetic Resonance Angiography (MRA) method.
Figure 3:
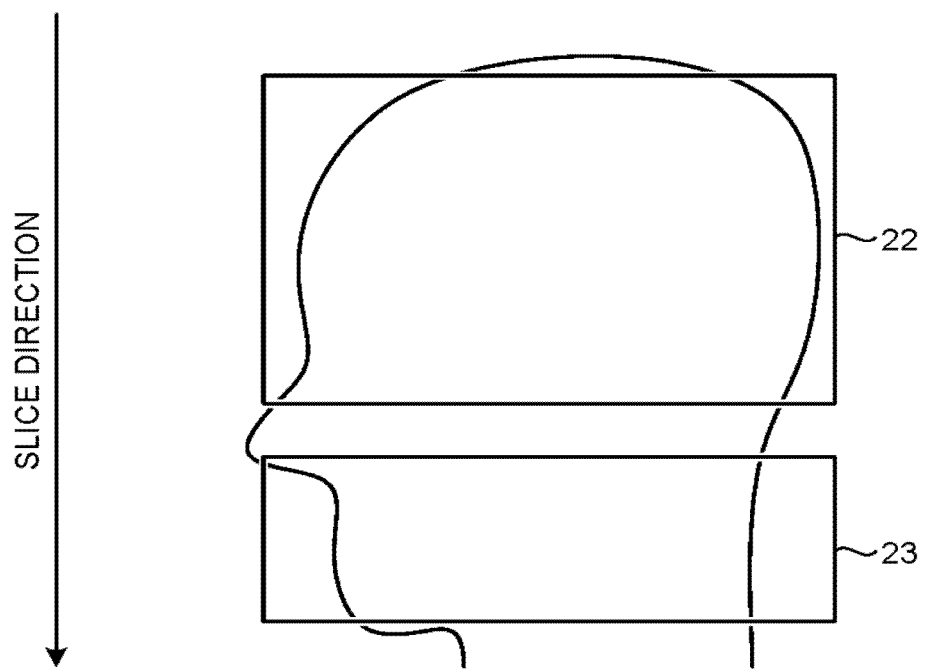
FIG. 3 is another drawing for explaining the example in which the image taking process is performed by implementing the 3D Dynamic ASL MRA method.
Figure 4:
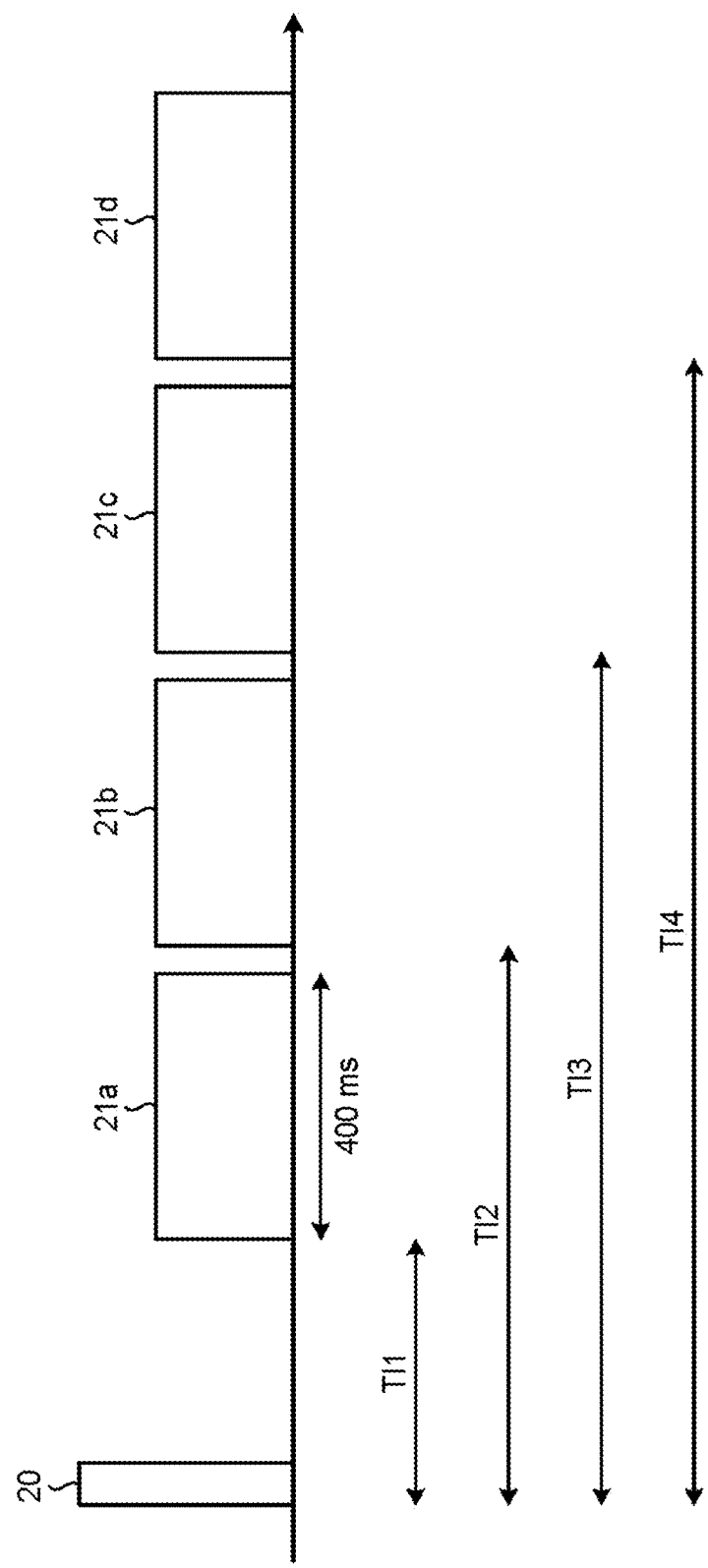
FIG. 4 is yet another drawing for explaining the example in which the image taking process is performed by implementing the 3D Dynamic ASL MRA method.

FIGS. 2 to 4 are drawings for explaining the example in which the image taking process is performed by implementing the 3D Dynamic ASL MRA method.

FIG. 2 illustrates examples of timing with which tag pulses are applied and timing with which data is acquired in an entire image taking process. FIG. 3 illustrates examples of an image taking region from which the data is acquired and a labeled region to which the tag pulses are applied. FIG. 4 illustrates examples of time periods (TI periods) each extending from a time at which one tag pulse is applied to a different one of a plurality of times at which MR signals are acquired.

As illustrated in the examples in FIGS. 2 to 4, by applying a tag pulse 20 to a labeled region 23 that is independently of an image taking region 22, the MRI apparatus performs a process of selectively rendering a fluid (e.g., a body fluid such as the blood or the cerebrospinal fluid [CSF] of the patient) and imaging the state of the fluid observed after any of the TI periods has elapsed, by labeling the fluid present in the labeled region 23 and arranging the signal value of the fluid flowing into or flowing out of the inside of the image taking region 22 after the TI period has elapsed to be relatively higher or lower. In this situation, for example, the labeled region 23 is set on the upstream side of the image taking region 22 in terms of the fluid flowing direction.

For example, at the time when "TI1" has elapsed as a TI period (hereinafter, simply "TI") since a tag pulse 20 is applied to the labeled region 23, the MRI apparatus performs an MR signal acquiring process (a data acquiring process) 21a on the image taking region 22. Further, at the time when "TI2" has elapsed as a TI since the tag pulse 20 is applied to the labeled region 23, the MRI apparatus performs a data acquiring process 21b. In addition, at the time when "TI3" has elapsed as a TI since the tag pulse 20 is applied to the labeled region 23, the MRI apparatus performs a data acquiring process 21c. Furthermore, at the time when "TI4" has elapsed as a TI since the tag pulse 20 is applied to the labeled region 23, the MRI apparatus performs a data acquiring process 21d. In the manner described above, according to the 3D Dynamic ASL MRA method, the state of the fluid of the patient is imaged at each of the times corresponding to a different one of the plurality of TI periods.

Further, in the present example, the number of slice encoding processes is set to "20". Accordingly, as illustrated in FIG. 2, a set 17 made up of the application of a tag pulse 20 and the data acquiring processes 21a to 21d is repeatedly performed twenty times. In this situation, the "set" denotes a set made up of one or more data acquiring processes performed with a shot at one time. The application of each tag pulse 20 is called a "shot". In other words, with respect to a "shot" at one time, a piece of data for one slice encoding process corresponding to "TI1", another piece of data for one slice encoding process corresponding to "TI2", yet another piece of data for one slice encoding process corresponding to "TI3", and yet another piece of data for one slice encoding process corresponding to "TI4" is acquired. The piece of data for the one slice encoding process corresponding to "TI1" is the data acquired during the data acquiring process 21a performed at one time. Further, the piece of data for the one slice encoding process corresponding to "TI2" is the data acquired during the data acquiring process 21b performed at one time. In addition, the piece of data for the one slice encoding process corresponding to "TI3" is the data acquired during the data acquiring process 21c performed at one time. Furthermore, the piece of data for the one slice encoding process corresponding to "TI4" is the data acquired during the data acquiring process 21d performed at one time.

Further, the number of times the tag pulse 20 is applied in the entire image taking process will be referred to as the "number of shots". The "number of shots" is equal to a value obtained by multiplying the number of slice encoding processes by the number of divided segments in the data acquiring processes. When the number of divided segments is "1" and the number of slice encoding processes is "20", the "number of shots" is "20". Further, the time period between any two tag pulses 20 that are temporally adjacent to each other will be referred to as a "shot interval".

Figure 5:
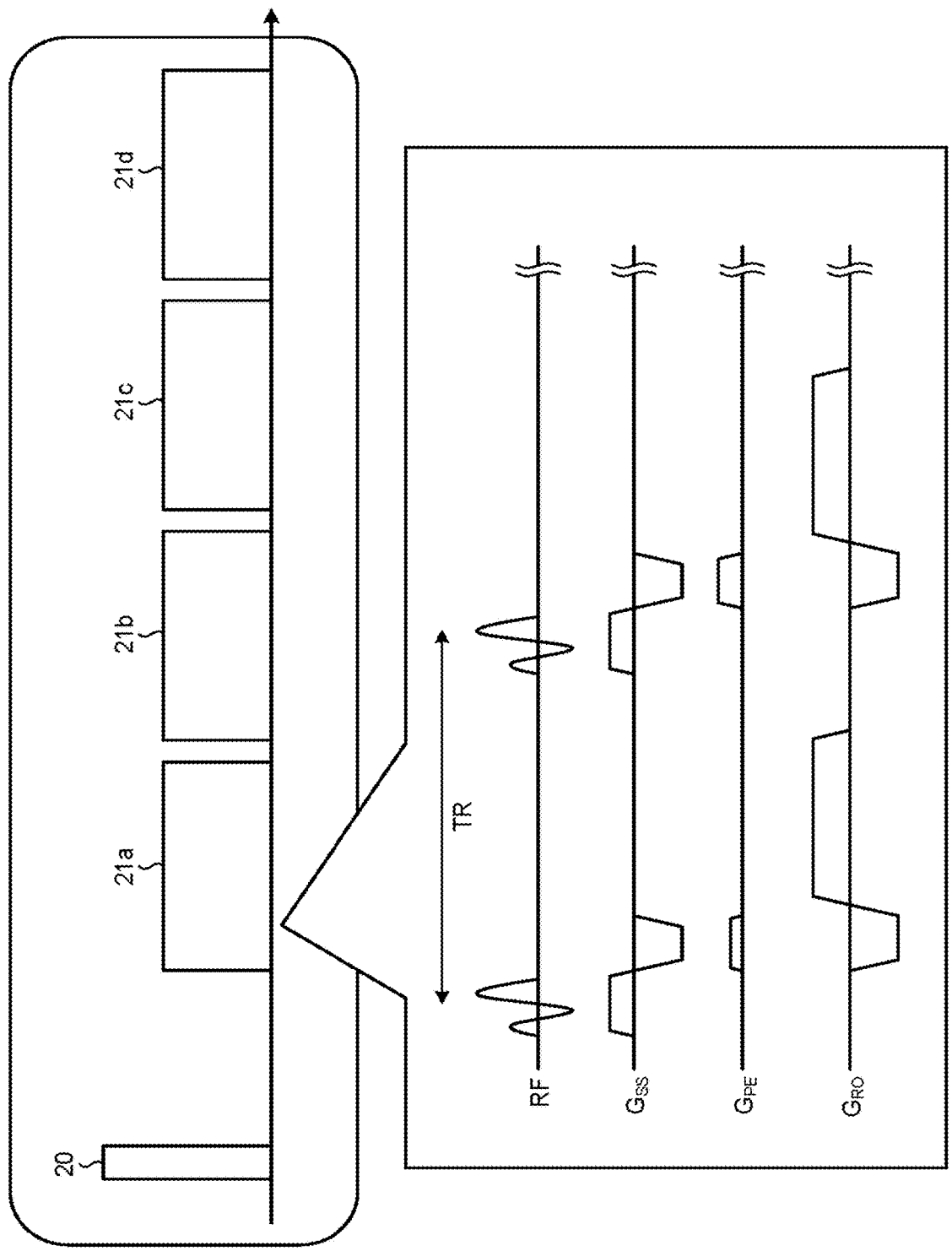
FIG. 5 is a chart illustrating an example of an acquisition sequence for data acquiring processes performed at one time.

FIG. 5 is a chart illustrating an example of an acquisition sequence (an image taking sequence) for data acquiring processes performed at one time. The example in FIG. 5 illustrates an example of an acquisition sequence for the data acquiring process 21a at one time. The acquisition sequence in the example in FIG. 5 illustrates the waveform of an RF pulse applied to the image taking region 22 and chronological changes in the magnetic field intensities of a slice gradient magnetic field $G_{SS}$, a phase-encoding gradient magnetic field $G_{PE}$, and a read-out gradient magnetic field $G_{RO}$ observed when an electric current is supplied to each of the three coils structuring the gradient coil 2.

In the example illustrated in FIG. 5, the repetition time (TR) is 4 ms, while the phase-encoding (PE) matrix is 100. Accordingly, as illustrated in the example in FIG. 4 explained above, the acquisition period of the data acquiring process 21a at one time can be calculated as 400 ms (=TR (4 ms)×PE Matrix (100)). Because the acquisition sequence of each of the data acquiring processes 21b and 21c is also the same as that of the data acquiring process 21a, the acquisition period is 400 ms. The PE Matrix may be referred to as the number of times of acquiring processes. Further, the acquisition period may be referred to as an image taking period.

Figure 6:
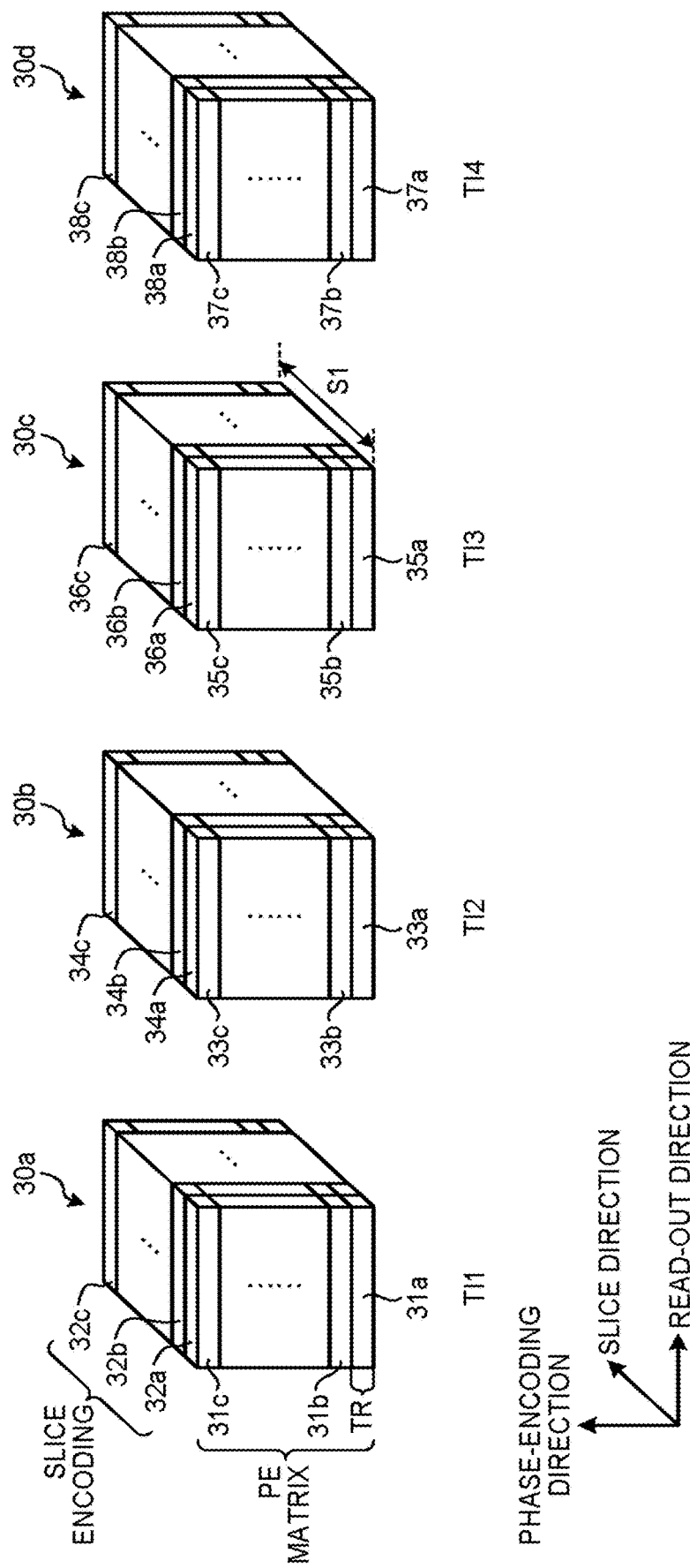
FIG. 6 is a drawing for explaining an example of 3D data in a k-space acquired by implementing the 3D Dynamic ASL MRA method.

Next, an example of 3D data in a k-space that is acquired by implementing the 3D Dynamic ASL MRA method will be explained, with reference to FIG. 6. FIG. 6 is a drawing for explaining the example of the 3D data in the k-space acquired by implementing the 3D Dynamic ASL MRA method.

The example in FIG. 6 illustrates a piece of 3D data 30a corresponding to "TI1", a piece of 3D data 30b corresponding to "TI2", a piece of 3D data 30c corresponding to "TI3", and a piece of 3D data 30d corresponding to "TI4". The pieces of 3D data 30a to 30d illustrated in the example in FIG. 6 are schematically expressed.

First, the piece of 3D data 30a will be explained. The example in FIG. 6 illustrates a piece of data 31a acquired as the data in the first line among the 100 (PE Matrix) lines in total in the phase-encoding direction, during the data acquiring process 21a performed at the time when "TI1" has elapsed as a TI since the tag pulse 20 for the first time is applied among the tag pulses 20 applied twenty times in total (slice encoding processes). Further, the example in FIG. 6 illustrates another piece of data 31b acquired as the data in the second line, during the data acquiring process 21a performed at the time when "TI1" has elapsed as a TI since the tag pulse 20 for the first time is applied. Similarly, the pieces of data in the third to the 99th lines are also acquired, although not illustrated. Further, the example in FIG. 6 illustrates another piece of data 31c acquired as the data in the 100th line, during the data acquiring process 21a performed at the time when "TI1" has elapsed as a TI since the tag pulse 20 for the first time is applied. In this manner, a piece of data 32*a* corresponding to one slice encoding process structured with the pieces of data in the first to the 100th lines is acquired during the data acquiring process 21*a* performed at the time when "TI1" has elapsed as a TI since the tag pulse 20 for the first time is applied.

Further, a piece of data 32*b* corresponding to one slice encoding process structured with the pieces of data in the first to the 100th lines is similarly acquired during the data acquiring process 21*a* performed at the time when "TI1" has elapsed as a TI since the tag pulse 20 for the second time is applied. Similarly, although not illustrated, a piece of data corresponding to one slice encoding process structured with the pieces of data in the first to the 100th lines is also acquired during each of the data acquiring processes 21*a* performed at the times when "TI1" has elapsed as a TI since the tag pulses 20 for the third through the nineteenth times are applied. Furthermore, similarly, a piece of data 32*c* corresponding to one slice encoding process structured with the pieces of data in the first to the 100th lines is also acquired during the data acquiring process 21*a* performed at the time when "TI1" has elapsed as a TI since the tag pulse 20 for the twentieth time is applied. In this manner, by repeatedly performing the data acquiring process 21*a* twenty times, the piece of 3D data 30*a* structured with twenty pieces of data corresponding to slice encoding processes is acquired. Accordingly, the data acquiring processes 21*a* correspond to an acquisition sequence used for acquiring the 3D data.

Next, the piece of 3D data 30*b* will be explained. The example in FIG. 6 illustrates a piece of data 33*a* acquired as the data in the first line, during the data acquiring process 21*b* performed at the time when "TI2" has elapsed as a TI since the tag pulse 20 for the first time is applied. Further, the example in FIG. 6 illustrates another piece of data 33*b* acquired as the data in the second line, during the data acquiring process 21*b* performed at the time when "TI2" has elapsed as a TI since the tag pulse 20 for the first time is applied. Similarly, the pieces of data in the third to the 99th lines are also acquired, although not illustrated. Further, the example in FIG. 6 illustrates another piece of data 33*c* acquired as the data in the 100th line, during the data acquiring process 21*b* performed at the time when"TI2" has elapsed as a TI since the tag pulse 20 for the first time is applied. In this manner, a piece of data 34*a* corresponding to one slice encoding process structured with the pieces of data in the first to the 100th lines is acquired during the data acquiring process 21*b* performed at the time when "TI2" has elapsed as a TI since the tag pulse 20 for the first time is applied.

Further, similarly, a piece of data 34*b* corresponding to one slice encoding process structured with the pieces of data in the first to the 100th lines is also acquired during the data acquiring process 21*b* performed at the time when "TI2" has elapsed as a TI since the tag pulse 20 for the second time is applied. Similarly, although not illustrated, a piece of data corresponding to one slice encoding process structured with the pieces of data in the first to the 100th lines is also acquired during each of the data acquiring processes 21*b* performed at the times when "TI2" has elapsed as a TI since the tag pulses 20 for the third through the nineteenth times are applied. Furthermore, similarly, a piece of data 34*c* corresponding to one slice encoding process structured with the pieces of data in the first to the 100th lines is also acquired during the data acquiring process 21*b* performed at the time when "TI2" has elapsed as a TI since the tag pulse 20 for the twentieth time is applied. In this manner, by repeatedly performing the data acquiring process 21*b* twenty times, the piece of 3D data 30*b* structured with twenty pieces of data corresponding to slice encoding processes is acquired. Accordingly, the data acquiring processes 21*b* correspond to an acquisition sequence used for acquiring the 3D data.

Next, the piece of 3D data 30*c* will be explained. The example in FIG. 6 illustrates a piece of data 35*a* acquired as the data in the first line, during the data acquiring process 21*c* performed at the time when "TI3" has elapsed as a TI since the tag pulse 20 for the first time is applied. Further, the example in FIG. 6 illustrates another piece of data 3*b* acquired as the data in the second line, during the data acquiring process 21*c* performed at the time when "TI3" has elapsed as a TI since the tag pulse 20 for the first time is applied. Similarly, the pieces of data in the third to the 99th lines are also acquired, although not illustrated. Further, the example in FIG. 6 illustrates another piece of data 35*c* acquired as the data in the 100th line, during the data acquiring process 21*c* performed at the time when "TI3" has elapsed as a TI since the tag pulse 20 for the first time is applied. In this manner, a piece of data 36*a* corresponding to one slice encoding process structured with the pieces of data in the first to the 100th lines is acquired during the data acquiring process 21*c* performed at the time when "TI3" has elapsed as a TI since the tag pulse 20 for the first time is applied.

Further, similarly, a piece of data 36*b* corresponding to one slice encoding process structured with the pieces of data in the first to the 100th lines is also acquired during the data acquiring process 21*c* performed at the time when "TI3" has elapsed as a TI since the tag pulse 20 for the second time is applied. Similarly, although not illustrated, a piece of data corresponding to one slice encoding process structured with the pieces of data in the first to the 100th lines is also acquired during each of the data acquiring processes 21*c* performed at the times when "TI3" has elapsed as a TI since the tag pulses 20 for the third through the nineteenth times are applied. Furthermore, similarly, a piece of data 36*c* corresponding to one slice encoding process structured with the pieces of data in the first to the 100th lines is also acquired during the data acquiring process 21*c* performed at the time when "TI3" has elapsed as a TI since the tag pulse 20 for the twentieth time is applied. In this manner, by repeatedly performing the data acquiring process 21*c* twenty times, the piece of 3D data 30*c* structured with twenty pieces of data corresponding to slice encoding processes is acquired. Accordingly, the data acquiring processes 21*c* correspond to an acquisition sequence used for acquiring the 3D data.

Next, the piece of 3D data 30*d* will be explained. The example in FIG. 6 illustrates a piece of data 37*a* acquired as the data in the first line, during the data acquiring process 21*d* performed at the time when "TI4" has elapsed as a TI since the tag pulse 20 for the first time is applied. Further, the example in FIG. 6 illustrates another piece of data 37*b* acquired as the data in the second line, during the data acquiring process 21*d* performed at the time when "TI4" has elapsed as a TI since the tag pulse 20 for the first time is applied. Similarly, the pieces of data in the third to the 99th lines are also acquired, although not illustrated. Further, the example in FIG. 6 illustrates another piece of data 37*c* acquired as the data in the 100th line, during the data acquiring process 21*d* performed at the time when "TI4" has elapsed as a TI since the tag pulse 20 for the first time is applied. In this manner, a piece of data 38*a* corresponding to one slice encoding process structured with the pieces of data in the first to the 100th lines is acquired during the data acquiring process 21d performed at the time when "TI4" has elapsed as a TI since the tag pulse 20 for the first time is applied.

Further, similarly, a piece of data 38b corresponding to one slice encoding process structured with the pieces of data in the first to the 100th lines is also acquired during the data acquiring process 21d performed at the time when "TI4" has elapsed as a TI since the tag pulse 20 for the second time is applied. Similarly, although not illustrated, a piece of data corresponding to one slice encoding process structured with the pieces of data in the first to the 100th lines is also acquired during each of the data acquiring processes 21d performed at the times when "TI4" has elapsed as a TI since the tag pulses 20 for the third through the nineteenth times are applied. Furthermore, similarly, a piece of data 38c corresponding to one slice encoding process structured with the pieces of data in the first to the 100th lines is also acquired during the data acquiring process 21d performed at the time when "TI4" has elapsed as a TI since the tag pulse 20 for the twentieth time is applied. In this manner, by repeatedly performing the data acquiring process 21d twenty times, the piece of 3D data 30d structured with twenty pieces of data corresponding to slice encoding processes is acquired. Accordingly, the data acquiring processes 21d correspond to an acquisition sequence used for acquiring the 3D data.

In this situation, it is desirable to improve the time resolution of the image display by arranging the time intervals to be short between image generating processes so as to have a large number of images in a unit time period. One of possible methods for improving the time resolution of the image display is to improve the time resolution during the data acquiring processes by arranging the acquisition periods short during the data acquiring processes for each time and arranging the number of times the data acquiring process is performed per unit time period to be large by shortening the interval between any two TI periods that are temporally adjacent to each other. In this situation, the interval between any two TI periods that are temporally adjacent to each other denotes, for example, the difference between two TI periods that are temporally adjacent to each other. For example, when two TI periods that are temporally adjacent to each other are "700 ms" and "900 ms", the interval between the two TI periods is "200 ms" (=900 ms−700 ms). In this situation, the interval between two TI periods that are temporally adjacent to each other is dependent on the acquisition period. Further, the acquisition period is dependent on the TR, the PE Matrix, and the like of the acquisition sequence. One of possible methods for improving the time resolution during data acquiring processes is to shorten the intervals between the TI periods by shortening the acquisition periods of the data acquiring processes for each time, by increasing the number of divided segments that are used when the data in a k-space is acquired over multiple times or by raising the multiple speed ratio of parallel imaging processes. However, if the number of divided segments were increased, although the acquisition periods of the acquiring processes for each time would decrease, the number of times the data acquiring process needs to be performed would increase because of the increase in the number of divided segments. Accordingly, the acquisition period as a whole would be longer. In contrast, if the multiple speed ratio of parallel imaging processes were raised, the signal-to-noise (S/N) ratio of the obtained images would be degraded, which would result in a lower level of image quality.

To cope with this situation, as explained hereinafter, the MRI apparatus 100 according to the present embodiment is configured to be able to improve the time resolution during data acquiring processes while preventing the acquisition period as a whole from becoming longer and preventing the S/N ratio of the obtained images from being degraded. In other words, the MRI apparatus 100 is configured to be able to achieve a high level of convenience, as explained below.

Returning to the description of FIG. 1, the processing circuitry 15 includes a setting function 15a, a generating function 15b, and a display controlling function 15c. The display controlling function 15c is an example of a display controlling unit.

In this situation, for example, processing functions of the constituent elements of the processing circuitry 15, namely, the setting function 15a, the generating function 15b, and the display controlling function 15c, are stored in the storage circuitry 11 in the form of computer-executable programs. The processing circuitry 15 realizes the functions corresponding to the programs by reading the programs from the storage circuitry 11 and executing the read programs. In other words, the processing circuitry 15 that has read the programs has the functions indicated in the processing circuitry 15 in FIG. 1. Although FIG. 1 illustrates the example in which the single processing circuitry 15 realizes the processing functions of the setting function 15a, the generating function 15b, and the display controlling function 15c, another arrangement is also acceptable in which the processing circuitry 15 is structured by combining together a plurality of independent processors, so that the processing functions are realized as a result of each of the processors executing a corresponding one of the programs.

The term "processor" used in the explanation above denotes, for example, a Central Processing Unit (CPU), a Graphics Processing Unit (GPU), or a circuit such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). It is also acceptable to directly incorporate the programs into the circuit of the processor, instead of storing the programs in the storage circuit 11. In that situation, the processor realizes the functions by reading and executing the programs incorporated in the circuit thereof.

Next, the processing functions, namely, the setting function 15a, the generating function 15b, and the display controlling function 15c, will be explained. The MRI apparatus 100 according to the present embodiment receives, from the operator, a temporal range during which it is desirable to improve the time resolution of the data acquiring process in a medical examination (the time resolution of the image display). Further, the MRI apparatus 100 generates sequence execution data in such a manner that the acquisition periods for each of the plurality of times becomes shorter and that the intervals between the TI periods become shorter in the received temporal range and further performs the data acquiring processes by executing the generated sequence execution data. As a result, it is possible to improve the time resolution during the data acquiring processes while preventing the acquisition period as a whole from becoming longer and preventing the S/N ratio of the obtained images from being degraded. In other words, the MRI apparatus 100 is able to achieve a high level of convenience.

Next, an example of the temporal range during which it is desirable to improve the time resolution will be explained. For example, when the operator knows at which time images of a lesion site such as a tumor are to be taken, a predetermined temporal range including such a time can be an example of the temporal range described above, because the operator wishes to check the changes in the state of the fluid in a temporally-dense manner, during a time span around such a time.

Figure 7:
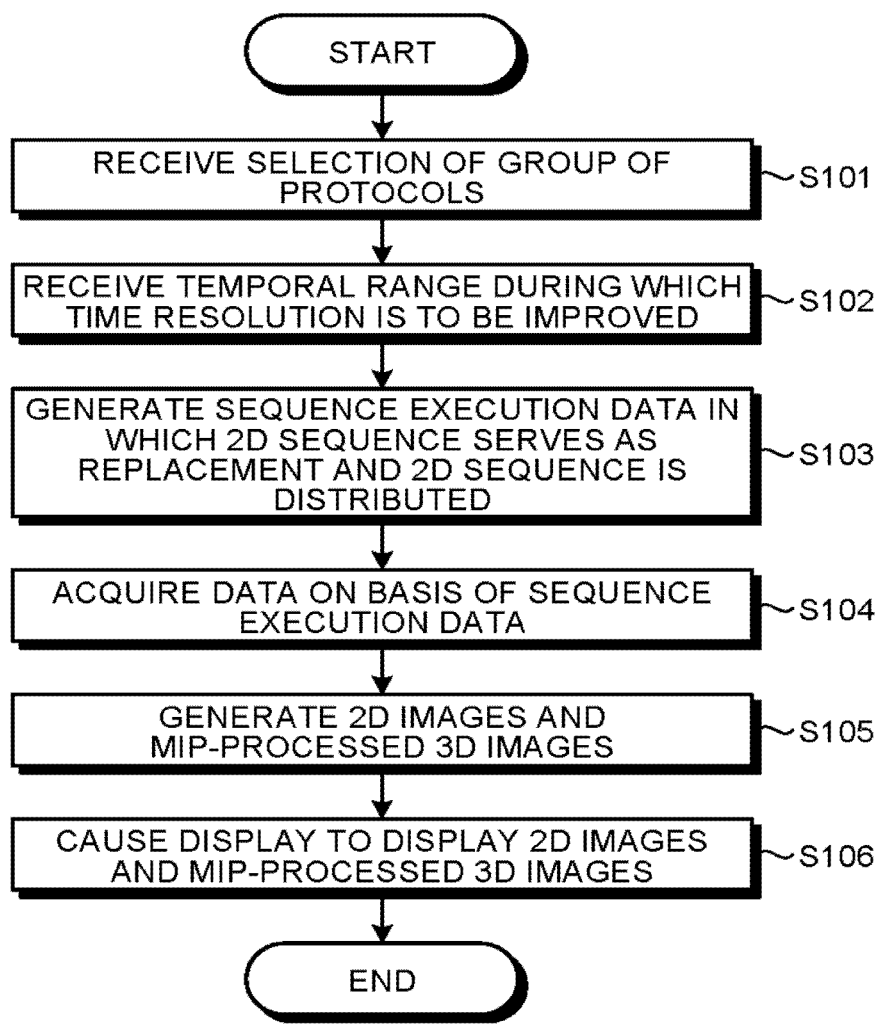
FIG. 7 is a flowchart illustrating a processing procedure according to the embodiment.

Next, a processing procedure during a medical examination according to the present embodiment will be explained. FIG. 7 is a flowchart illustrating the processing procedure according to present embodiment.

When a medical examination is started, as illustrated in FIG. 7, the setting function 15a causes the display 10 to display a protocol selecting screen used for receiving a selection of a group made up of a series of protocols included in the medical examination and further receives the selection of a group of protocols from the operator (step S101).

In this situation, the term "protocols" denote pulse sequence information including image taking condition setting information. Medical examinations that can be performed by the MRI apparatus 100 include a group made up of a series of pulse sequences such as various types of pre-scans and various types of imaging scans. Further, each of the pulse sequences is set with image taking conditions such as a TR value, a TE (echo time) value, a Flip Angle (FA), and the like. The MRI apparatus 100 is configured to manage and offer the pulse sequence information including such image taking condition setting information (including pre-set information that is set in advance), as the "protocols". For example, a group of protocols may include one or more of each of different types of protocols such as a protocol used for acquiring a position determining image, a protocol used for acquiring a sensitivity map, a protocol used for a shimming purpose, a protocol used for acquiring data (taking images or imaging), and the like.

For example, at step S101, the setting function 15a receives a group of protocols used for implementing the 3D Dynamic ASL MRA method explained above with reference to FIGS. 2 to 6, from the operator via the input circuitry 9. The explanation in the following sections is based on the assumption that the setting function 15a has received the group of protocols used for implementing the 3D Dynamic ASL MRA method at step S101. In other words, the explanation is based on the assumption that the setting function 15a has received the group of protocols used for executing the various types of processes described with reference to FIGS. 2 to 6.

Subsequently, the generating function 15b receives a temporal range during which the time resolution is to be improved in the pulse sequence indicated by the received group of protocols, from the operator via the input circuitry 9 (step S102). For example, at step S102, the generating function 15b receives a temporal range from the time when "TI3" has elapsed since the application of the tag pulse 20 to 400 ms later in the example in FIG. 4, as the temporal range during which the time resolution is to be improved. In other words, the generating function 15b receives the temporal range during which the data acquiring process 21c is performed as the temporal range during which the time resolution is to be improved. In another example, at step S102, when having received a TI period designated by the operator from among a plurality of TI periods (e.g., TI1 to TI4), the generating function 15b regards the temporal range from the time when the received TI period has elapsed to the time when the acquisition period of the data acquiring process corresponding to the received TI period has elapsed, as the range designated by the operator during which the time resolution is to be improved.

After that, the generating function 15b generates sequence execution data in which the 3D data sequence for the data acquiring processes performed during the temporal range is replaced with a 2D sequence so that the 2D sequence is distributed among the data acquiring processes repeatedly performed as many times as the number of slice encoding processes (step S103). At step S103, the generating function 15b transmits the generated sequence execution data to the executing function 13a. Further, the generating function 15b replaces the 3D data sequence for the data acquiring processes performed during the temporal range with the 2D sequence which is used for acquiring 2D data and in which a slice thickness corresponding to the lab thickness set in the 3D sequence as an image taking condition is set as an image taking condition.

Figure 8:
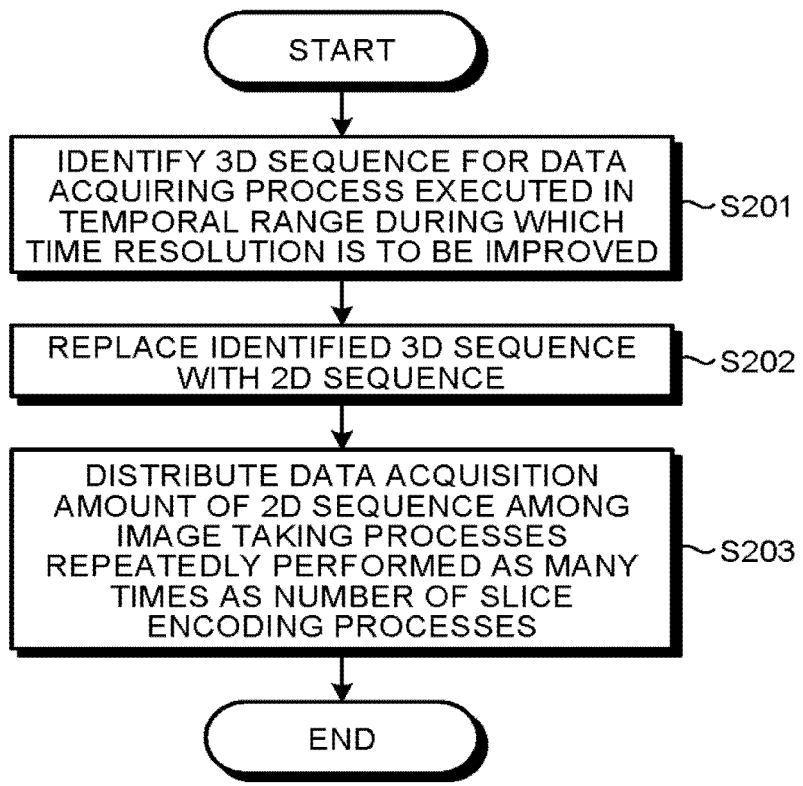
FIG. 8 is a flowchart illustrating details of the process at step S103.

Details of the process at step S103 will be explained. FIG. 8 is a flowchart illustrating details of the process at step S103. In the following sections, an example will be explained in which the range from the time when "TI3" has elapsed since the application of the tag pulse 20 and to 400 ms later in the example in FIG. 4 is received at step S102 as a temporal range during which the time resolution is to be improved. In that situation, as illustrated in FIG. 8, the generating function 15b identifies the 3D sequence for the data acquiring process performed during the received temporal range (step S201). For example, the generating function 15b identifies the 3D sequence for the data acquiring process 21c.

After that, the generating function 15b replaces the identified 3D sequence with a 2D sequence in which a slice thickness corresponding to the slab thickness set in the identified 3D sequence is set as an image taking condition (step S202). In his situation, as illustrated in the example in FIG. 6 explained above, when the slab thickness set in the identified 3D sequence is "S1", the generating function 15b replaces the 3D sequence with a 2D sequence in which a slice thickness "S2" corresponding to the slab thickness "S1" is set as an image taking condition.

In this situation, when a 2D sequence is used, there is no need to acquire pieces of data corresponding to slice encoding processes, unlike when a 3D sequence is used. Accordingly, the data acquisition amount of the 2D sequence can be calculated as TR (4 ms)×PE Matrix (100) (a data acquisition amount corresponding to the duration of 400 ms). In other words, the data acquisition amount of the 2D sequence corresponds to the data acquisition amount of the data corresponding to the one slice encoding process in the 3D sequence. As explained herein, the data acquisition amount of the 2D sequence replacing the 3D sequence can be calculated as "the data acquisition amount of the 3D sequence"×"1/20 (slice encoding processes)".

Further, the generating function 15b distributes the data acquisition amount of the 2D sequence (the data acquisition amount corresponding to the duration of 400 ms) among the image taking processes (the data acquiring processes) that are repeatedly performed as many times as the number of slice encoding processes (twenty times) (step S203).

Next, the process at step S203 will be explained. For example, at step S203, the generating function 15b calculates that the data amount to be acquired in a data acquiring process at each time is equal to "the data amount corresponding to the duration of 20 ms", by dividing the data acquisition amount of the 2D sequence (i.e., "the data acquisition amount corresponding to the duration of 400 ms") by the number of slice encoding processes "20".

Further, the generating function 15b changes relevant protocols among the group of protocols received at step S101 so that data is acquired in "a data amount corresponding to the duration of 20 ms" in the data acquiring processes in each of the sets repeated the plurality of times, by using the 2D sequence. Further, the generating function 15b changes relevant protocols among the group of protocols received at step S101 so that the 2D sequence to acquire the data in "a data amount corresponding to the duration of 20 ms" is performed multiple times (e.g., four times) during the data acquiring processes in each of the sets repeated the plurality of times. In other words, the generating function 15b changes the relevant protocols among the group of protocols received at step S101 so that as many pieces of 2D data in "a data amount corresponding to the duration of 20 ms" as a plurality of temporal phases are acquired in each of the sets, during the time period corresponding to 400 ms in which one region of the 3D data 30c is acquired.

Figure 9:
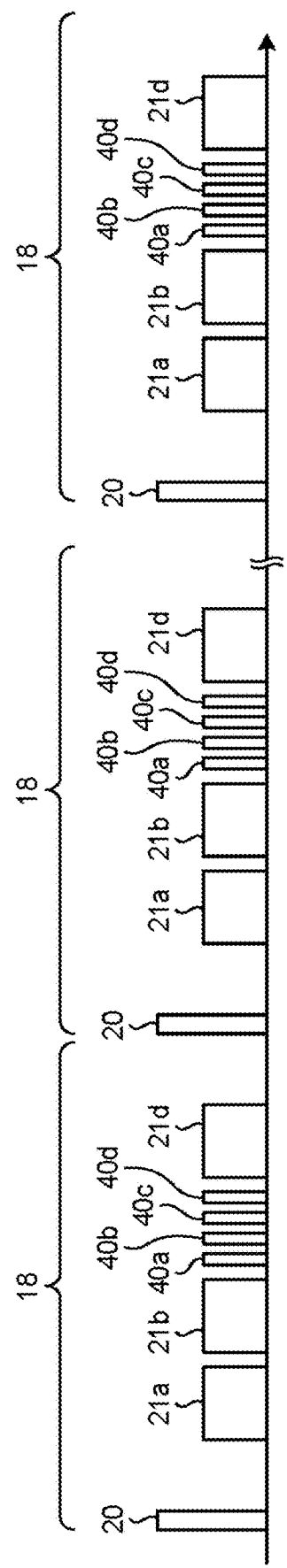
FIG. 9 is a chart for explaining an example in which a generating function according to the embodiment distributes a data acquisition amount of a two-dimensional (2D) sequence.
Figure 10:
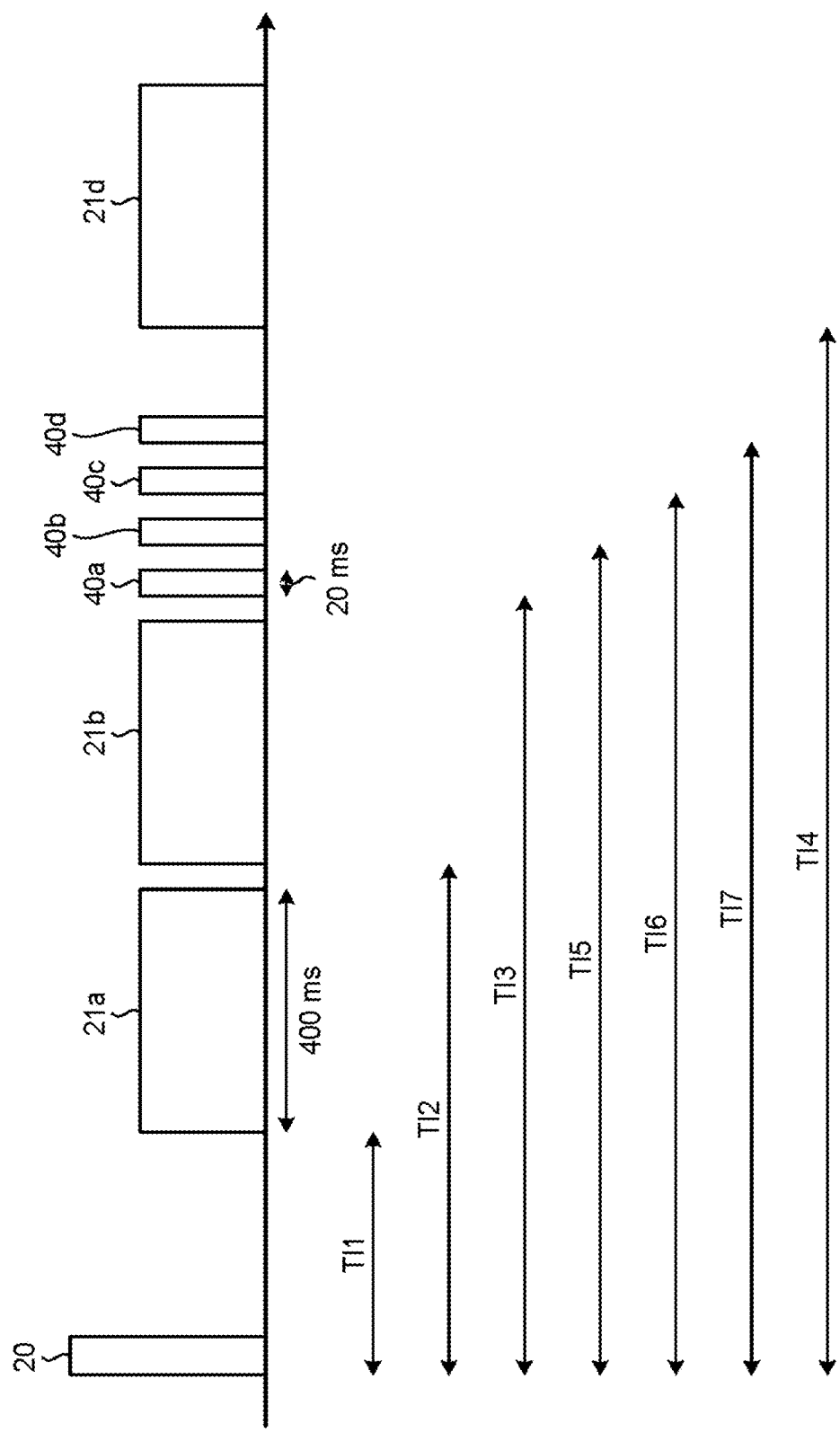
FIG. 10 is another chart for explaining the example in which the generating function according to the embodiment distributes the data acquisition amount of the 2D sequence.

FIGS. 9 and 10 are charts for explaining an example in which the generating function 15b according to the present embodiment distributes the data acquisition amount of the 2D sequence. FIG. 9 illustrates examples of timing with which tag pulses are applied and timing with which data is acquired in an entire image taking process, in the situation where the 3D sequence for the data acquiring process 21c has been replaced with a 2D sequence. FIG. 10 illustrates an example of the time periods (the TI periods) from a time at which one tag pulse is applied to a plurality of times at each of which an MR signal is acquired, in the situation where the 3D sequence for the data acquiring process 21c is replaced with the 2D sequence.

In the explanation provided with reference to FIGS. 9 and 10, some of the elements that are the same as those in the explanation provided above with reference to FIGS. 2 to 4 will be referred to by using the same reference characters, and the explanation thereof will be omitted. As illustrated in FIGS. 9 and 10, the generating function 15b changes a relevant protocol among the group of protocols received at step S101 so that a data acquiring process 40a is performed to acquire 2D data in "a data acquisition amount corresponding to the duration of 20 ms" at the time when "TI3" has elapsed as a TI since a tag pulse 20 is applied to the labeled region 23. Further, the generating function 15b changes a relevant protocol so that a data acquiring process 40b is performed to acquire 2D data in "a data acquisition amount corresponding to the duration of 20 ms" at the time when "TI5" has elapsed as a TI since the tag pulse 20 is applied to the labeled region 23. Further, the generating function 15b changes a relevant protocol so that a data acquiring process 40c is performed to acquire 2D data in "a data acquisition amount corresponding to the duration of 20 ms" at the time when "TI6" has elapsed as a TI since the tag pulse 20 is applied to the labeled region 23. Furthermore, the generating function 15b changes a relevant protocol so that a data acquiring process 40d is performed to acquire 2D data in "a data acquisition amount corresponding to the duration of 20 ms" at the time when "TI7" has elapsed as a TI since the tag pulse 20 is applied to the labeled region 23. In the present example, the data acquiring processes 40a to 40d correspond to a 2D sequence to acquire 2D data.

After that, the generating function 15b generates sequence execution data on the basis of the group of protocols including the changed protocols. Further, the generating function 15b transmits the generated sequence execution data to the executing function 13a.

In other words, at step S203, the generating function 15b generates sequence execution data used for implementing the 3D Dynamic ASL MRA method by which the executing function 13a performs the data acquiring processes 21a, 21b, 40a, 40b, 40c, 40d, and 21d the predetermined number of times (twenty times) to acquire data every time each of the plurality of waiting periods (namely, TI1, TI2, TI3, TI5, TI6, TI7, and TI4) has elapsed since the tag pulse 20 used for labeling the fluid flowing into the image taking region 22 of the patient S is applied.

In this situation, at step S203, the generating function 15b generates the sequence execution data by which, while implementing the 3D Dynamic ASL MRA method, the executing function 13a acquires the pieces of three-dimensional data 30a, 30b, and 30d, by acquiring the data corresponding to one slice encoding process at each of the twenty times during the data acquiring processes 21a, 21b, and 21d corresponding to the waiting periods TI1, TI2 and TI4 among the plurality of waiting periods TI1, TI2, TI3, TI5, TI6, TI7, and TI4.

Further, at step S203, the generating function 15b generates the sequence execution data by which, while implementing the 3D Dynamic ASL MRA method, the executing function 13a acquires data corresponding to the data of one slice encoding process by distributing the data acquisition of the data corresponding to the data of the one slice encoding process among the twenty times, during the data acquiring processes 40a to 40d that correspond to the waiting periods TI3, TI5, TI6, and TI7 that are different from the waiting periods TI1, TI2, and TI4. In this situation, the waiting periods TI1, TI2, and TI4 are examples of the first waiting period. The waiting periods TI3, TI5, TI6, and TI7 are examples of the second waiting period. Further, the data acquiring processes 21a, 21b, and 21d are examples of a first data acquiring processes. The data acquiring processes 40a to 40d are examples of a second data acquiring process.

In the present example, when the MRI apparatus 100 according to the present embodiment is used, the acquisition period of each of the data acquiring processes 40a to 40d is 20 ms, as illustrated in FIG. 10. Accordingly, during the temporal range designated by the operator, the interval between two adjacent TI periods is reduced from 400 ms to the minimum of 20 ms, and it is therefore possible to shorten the intervals between the TI periods. Thus, the MRI apparatus 100 according to the present embodiment is able to improve the time resolution during the data acquiring processes. Further, in the example illustrated in FIGS. 9 and 10, as explained later, four pieces of 2D data used for generating four images are acquired during the temporal range designated by the operator. In other words, during the temporal range designated by the operator, one image is generated when the data acquiring processes are performed in the manner illustrated in FIG. 4. In contrast, during the temporal range designated by the operator, four images are generated when the data acquiring processes are performed in the manner illustrated in FIGS. 9 and 10. Accordingly, because the time resolution during the data acquiring processes is improved, the time resolution during the display of the moving picture is improved.

Further, in the present embodiment, because the number of slice encoding processes is "20", a set 18 made up of the application of the tag pulse 20, the data acquiring processes 21a, 21b, and 21d and the data acquiring processes 40a to 40d is repeatedly performed twenty times, as illustrated in FIG. 9. In contrast, according to the pre-change group of protocols received at step S101, the set 17 made up of the application of the tag pulse 20 and the data acquiring processes 21a to 21d is repeatedly performed twenty times, as illustrated in FIG. 2 explained above. Thus, the number of times the set is performed is unchanged between the pre-change group of protocols and the group of protocols including the protocols changed at step S103. Further, the shot interval is unchanged between the pre-change group of protocols and the group of protocols including the changed protocols. Accordingly, the acquisition period as a whole is unchanged between the pre-change group of protocols and the group of protocols including the changed protocols. Consequently, by using the MRI apparatus 100 according to the present embodiment, it is possible to prevent the acquisition period as a whole from becoming longer.

Further, when the MRI apparatus 100 according to the present embodiment is used, there is no need to raise the multiple speed ratio even when a parallel imaging process is performed, and it is therefore not necessary to change the multiple speed ratio. Accordingly, when the MRI apparatus 100 according to the present embodiment is used, the S/N ratio of the obtained images is not degraded. Consequently, by using the MRI apparatus 100 according to the present embodiment, it is possible to prevent the S/N ratio of the obtained images from being degraded. It means that, by using the MRI apparatus 100 according to the present embodiment, it is possible to prevent, the quality of the obtained images from being degraded.

As explained above, by using the MRI apparatus 100 according to the present embodiment, it is possible to improve the time resolution during the data acquiring processes, while preventing the acquisition period as a whole from becoming longer and preventing the S/N ratio of the obtained images from being degraded. In other words, the MRI apparatus 100 according to the present embodiment is able to achieve a high level of convenience.

Returning to the description of FIG. 7, at step S104, when having received the sequence execution data transmitted thereto by the generating function 15b, the executing function 13a acquires data by performing the processes described below, on the basis of the sequence execution data: The executing function 13a applies a tag pulse 20 to the labeled region 23 twenty times by using a predetermined shot interval. Further, the executing function 13a performs the data acquiring process 21a at the time when "TI1" has elapsed as a TI, since each of the tag pulses 20 is applied. Further, the executing function 13a performs the data acquiring process 21b at the time when "TI2" has elapsed as a TI, since each of the tag pulses 20 is applied. Further, the executing function 13a performs the data acquiring process 40a to acquire 2D data at the time when "TI3" has elapsed as a TI, since each of the tag pulses 20 is applied. In addition, the executing function 13a performs the data acquiring process 40b to acquire 2D data at the time when "TI5" has elapsed as a TI, since each of the tag pulses 20 is applied. Further, the executing function 13a performs the data acquiring process 40c to acquire 2D data at the time when "TI6" has elapsed as a TI, since each of the tag pulses 20 is applied. Also, the executing function 13a performs the data acquiring process 40d to acquire 2D data at the time when "TI7" has elapsed as a TI, since each of the tag pulses 20 is applied. Furthermore, the executing function 13a performs the data acquiring process 21d at the time when "TI4" has elapsed as a TI, since each of the tag pulses 20 is applied (step S104).

As explained above, the MRI apparatus 100 according to the present embodiment is configured to perform, at step S104, the data acquiring processes in the tag mode in which a piece of data is acquired when each of the TI periods has elapsed since the tag pulse 20 used for labeling the fluid flowing into the image taking region 22 of the patient S is applied to the labeled region 23.

Figure 11:
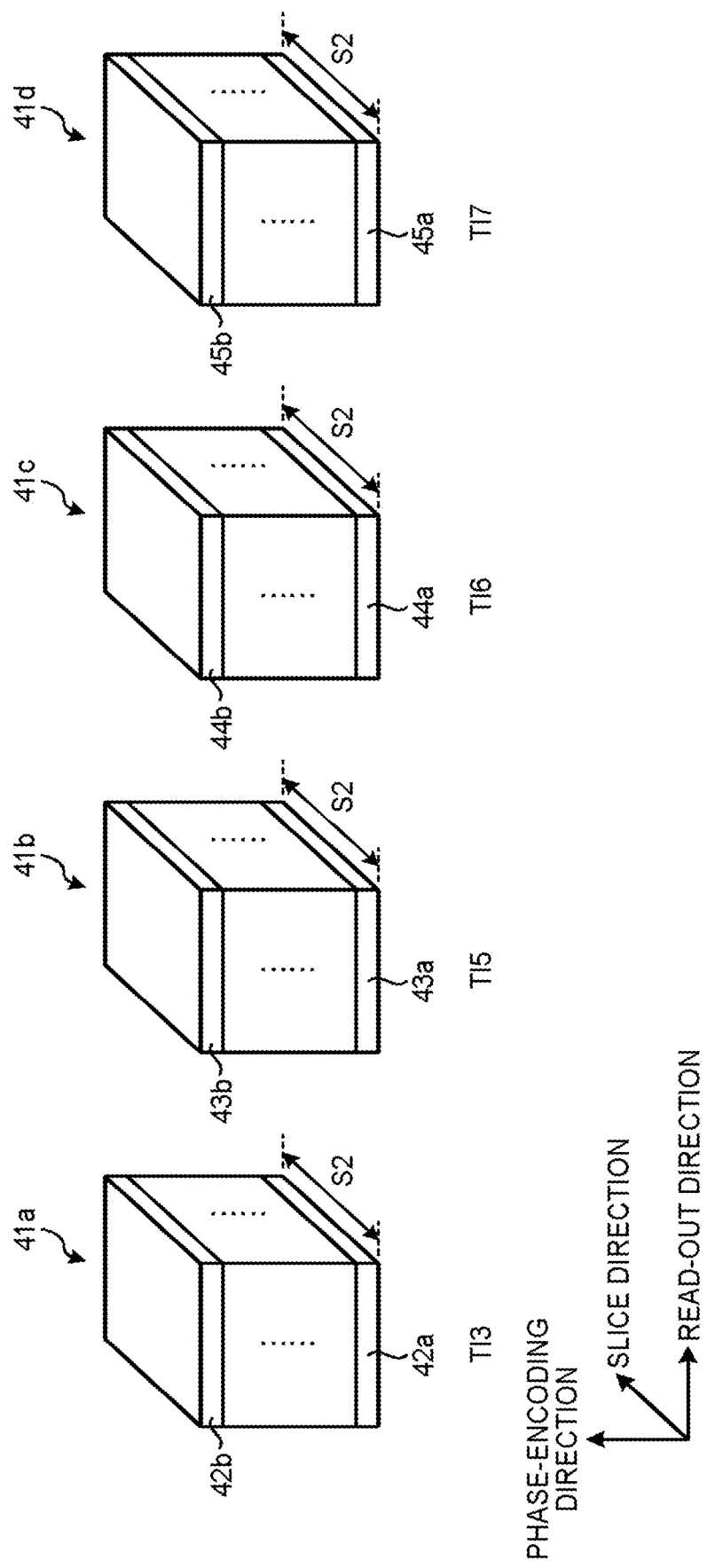
FIG. 11 is a drawing for explaining an example of pieces of 2D data in a k-space acquired at step S104.

Next, an example of the pieces of 2D data in the k-space acquired at step S104 will be explained, with reference to FIG. 11. Because the pieces of 3D data in the k-space acquired at step S104 are the same as the pieces of 3D data 30a, 30b, and 30d explained above with reference to FIG. 6, the explanation thereof will be omitted. FIG. 11 is a drawing for explaining an example of the pieces of 2D data in the k-space acquired at step S104.

The example in FIG. 11 illustrates a piece of 2D data 41a corresponding to "TI3", another piece of 2D data 41b corresponding to "TI5", yet another piece of 2D data 41c corresponding to "TI6", and yet another piece of 2D data 41d corresponding to "TI7". The pieces of 2D data 41a to 41d illustrated in the example in FIG. 11 are schematically expressed.

First, the piece of 2D data 41a will be explained. The example in FIG. 11 illustrates a piece of data 42a acquired during a data acquiring process 40a performed at the time when "TI3" has elapsed as a TI since the tag pulse 20 for the first time is applied. Further, although not illustrated, a piece of data is also similarly acquired during each of the data acquiring processes 40a performed at the times when "TI3" has elapsed as a TI since the tag pulses 20 for the second through the nineteenth times are applied. Further, the example in FIG. 11 illustrates a piece of data 42b acquired during the data acquiring process 40a performed at the time when "TI3" has elapsed as a TI since the tag pulse 20 for the twentieth time is applied.

As explained above, as a result of the data acquiring process 40a being repeatedly performed twenty times, the piece of 2D data 41a structured with twenty pieces of data is acquired. The data acquisition amount of the piece of 2D data 41a corresponds to the data acquisition amount of the data corresponding to one slice encoding process in the 3D sequence. For example, the data acquisition amount of the piece of 2D data 41a corresponds to the data acquisition amount of the piece of data 36a illustrated in FIG. 6 explained above.

Next, the piece of 2D data 41b will be explained. The example in FIG. 11 illustrates a piece of data 43a acquired during a data acquiring process 40b performed at the time when "TI5" has elapsed as a TI since the tag pulse 20 for the first time is applied. Further, although not illustrated, a piece of data is also similarly acquired during each of the data acquiring processes 40b performed at the times when "TI5" has elapsed as a TI since the tag pulses 20 for the second through the nineteenth times are applied. Further, the example in FIG. 11 illustrates a piece of data 43b acquired during the data acquiring process 40b performed at the time when "TI5" has elapsed as a TI since the tag pulse 20 for the twentieth time is applied.

As explained above, as a result of the data acquiring process 40b being repeatedly performed twenty times, the piece of 2D data 41b structured with twenty pieces of data is acquired. The data acquisition amount of the piece of 2D data 41b corresponds to the data acquisition amount of the data corresponding to one slice encoding process in the 3D sequence.

Next, the piece of 2D data 41c will be explained. The example in FIG. 11 illustrates a piece of data 44a acquired during a data acquiring process 40c performed at the time when "TI6" has elapsed as a TI since the tag pulse 20 for the first time is applied. Further, although not illustrated, a piece of data is also similarly acquired during each of the data acquiring processes 40c performed at the times when "TI6" has elapsed as a TI since the tag pulses 20 for the second through the nineteenth times are applied. Further, the example in FIG. 11 illustrates a piece of data 44b acquired during a data acquiring process 40c performed at the time when "TI6" has elapsed as a TI since the tag pulse 20 for the twentieth time is applied.

As explained above, as a result of the data acquiring process 40c being repeatedly performed twenty times, the piece of 2D data 41c structured with twenty pieces of data is acquired. The data acquisition amount of the piece of 2D data 41c corresponds to the data acquisition amount of the data corresponding to one slice encoding process in the 3D sequence.

Next, the piece of 2D data 41d will be explained. The example in FIG. 11 illustrates a piece of data 45a acquired during a data acquiring process 40d performed at the time when "TI7" has elapsed as a TI since the tag pulse 20 for the first time is applied. Further, although not illustrated, a piece of data is also similarly acquired during each of the data acquiring processes 40d performed at the times when "TI7" has elapsed as a TI since the tag pulses 20 for the second through the nineteenth times are applied. Further, the example in FIG. 11 illustrates a piece of data 45b acquired during a data acquiring process 40d performed at the time when "TI7" has elapsed as a TI since the tag pulse 20 for the twentieth time is applied.

As explained above, as a result the data acquiring process 40d being repeatedly performed twenty times, the piece of 2D data 41d structured with twenty pieces of data is acquired. The data amount of the piece of 2D data 41d corresponds to the data amount of the data corresponding to one slice encoding process in the 3D sequence.

In this situation, as illustrated in FIG. 11, the slice thickness of the pieces of 2D data 41a to 41d is "S2" corresponding to the slab thickness "S1" of the piece of 3D data 30c described above. In other words, the slice thickness "S2" of each of the pieces of 2D data 41a to 41d is equal to the thickness corresponding to the entirety of the piece of 3D data 30c including a plurality of slice encoding processes.

As explained above, at step S104, the executing function 13a implements the 3D Dynamic ASL MRA method by which the data acquiring processes 21a, 21b, 40a, 40b, 40c, 40d, and 21d are performed the predetermined number of times (twenty times), the acquiring processes being configured to acquire data every time each of the plurality of waiting periods TI1, TI2, TI3, TI5, TI6, TI7, and TI4 has elapsed since the tag pulse 20 used for labeling the fluid flowing into the image taking region 22 of the patient S is applied. In other words, the executing function 13a executes the pulse sequence by which the data acquiring processes 21a, 21b, 40a, 40b, 40c, 40d, and 21d are repeatedly performed the predetermined number of times.

Further, at step S104, when implementing the 3D Dynamic ASL MRA method, the executing function 13a acquires the pieces of three-dimensional data 30a, 30b, and 30d by acquiring the data corresponding to one slice encoding process at each of the twenty times, during the data acquiring processes 21a, 21b, and 21d corresponding to the waiting periods TI1, TI2, and TI4 that are among the plurality of waiting periods TI1, TI2, TI3, TI5, TI6, TI7, and TI4. In other words, at each of the twenty times, during the data acquiring process 21a corresponding to the waiting period TI1, the executing function 13a acquires, by using the 3D sequence, the data corresponding to one region, out of the piece of 3D data 30a acquired as being divided into the plurality of regions. Also, at each of the twenty times, during the data acquiring process 21b corresponding to the waiting period TI2, the executing function 13a acquires, by using the 3D sequence, the data corresponding to one region, out of the piece of 3D data 30b acquired as being divided into the plurality of regions. Furthermore, at each of the twenty times, during the data acquiring process 21d corresponding to the waiting period TI4, the executing function 13a acquires, by using the 3D sequence, the data corresponding to one region, out of the piece of 3D data 30d acquired as being divided into the plurality of regions.

Further, at step S104, when implementing the 3D Dynamic ASL MRA method, the executing function 13a acquires the pieces of data 41a to 41d corresponding to the data of one slice encoding process, by distributing the data acquisition of the data corresponding to the data of the one slice encoding process among the twenty times, during the data acquiring processes 40a to 40d that correspond to the waiting periods TI3, TI5, TI6, and TI7 that are different from the waiting periods TI1, TI2, and TI4. In other words, at each of the twenty times, during the data acquiring processes 40a to 40d corresponding to the waiting periods TI3, TI5, TI6, and TI7, the executing function 13a acquires, by using the 2D sequence, the data allocated to the one time, out of the slice of 2D data corresponding to the entirety of the piece of 3D data 30c. Further, at each of the twenty times, the executing function 13a acquires as many pieces of 2D data each in "a data amount corresponding to the duration of 20 ms" as the plurality of temporal phases, during the time period corresponding to the duration of 400 ms in which the data in the one region of the 3D data 30c is acquired.

Returning to the description of FIG. 7, the image generating function 14a generates 2D images and 3D images on which a Maximum Intensity Projection (MIP) process has been performed, on the basis of the data acquired by the data acquiring processes performed at step S104 (step S105).

For example, the image generating function 14a generates a 3D image (volume data) corresponding to TI1, on the basis of the piece of 3D data 30a acquired during the data acquiring process 21a performed twenty times. Further, the image generating function 14a generates a 3D image corresponding to TI2, on the basis of the piece of 3D data 30b acquired during the data acquiring process 21b performed twenty times. Further, the image generating function 14a generates a 3D image corresponding to TI4, on the basis of the piece of 3D data 30d acquired during the data acquiring process 21d performed twenty times.

After that, the image generating function 14a performs the MIP process on the generated 3D images.

Further, the image generating function 14a generates a 2D image corresponding to TI3, on the basis of the piece of 2D data 41a acquired during the data acquiring process 40a performed twenty times. Also, the image generating function 14a generates a 2D image corresponding to TI5, on the basis of the piece of 2D data 41b acquired during the data acquiring process 40b performed twenty times. In addition, the image generating function 14a generates a 2D image corresponding to TI6, on the basis of the piece of 2D data 41c acquired during the data acquiring process 40c performed twenty times. Furthermore, the image generating function 14a generates a 2D image corresponding to TI7, on the basis of the piece of 2D data 41d acquired during the data acquiring process 40d performed twenty times.

Further, the display controlling function 15c causes the display 10 to display the 2D images and the MIP-processed 3D images generated at step S105 (step S106) and ends the process.

For example, at step S106, the display controlling function 15c causes the display 10 to display either one of the 2D images or one of the MIP-processed 3D images in correspondence with each of the TI periods. As a result, the display 10 displays a moving picture by serially displaying, in a time series, the images indicating the state of the fluid such as the blood or the cerebrospinal fluid of the patient in correspondence with the TI periods. In a specific example, the display controlling function 15c, at first, causes the MIP-processed 3D image corresponding to TI1 to be displayed. Subsequently, the display controlling function 15c causes the MIP-processed 3D image corresponding to TI2 to be displayed. After that, the display controlling function 15c causes the 2D image corresponding to TI3 to be displayed. Subsequently, the display controlling function 15c causes the 2D image corresponding to TI5 to be displayed. After that, the display controlling function 15c causes the 2D image corresponding to TI6 to be displayed. Subsequently, the display controlling function 15c causes the 2D image corresponding to TI7 to be displayed. After that, the display controlling function 15c causes the MIP-processed 3D image corresponding to TI4 to be displayed.

Figure 12:
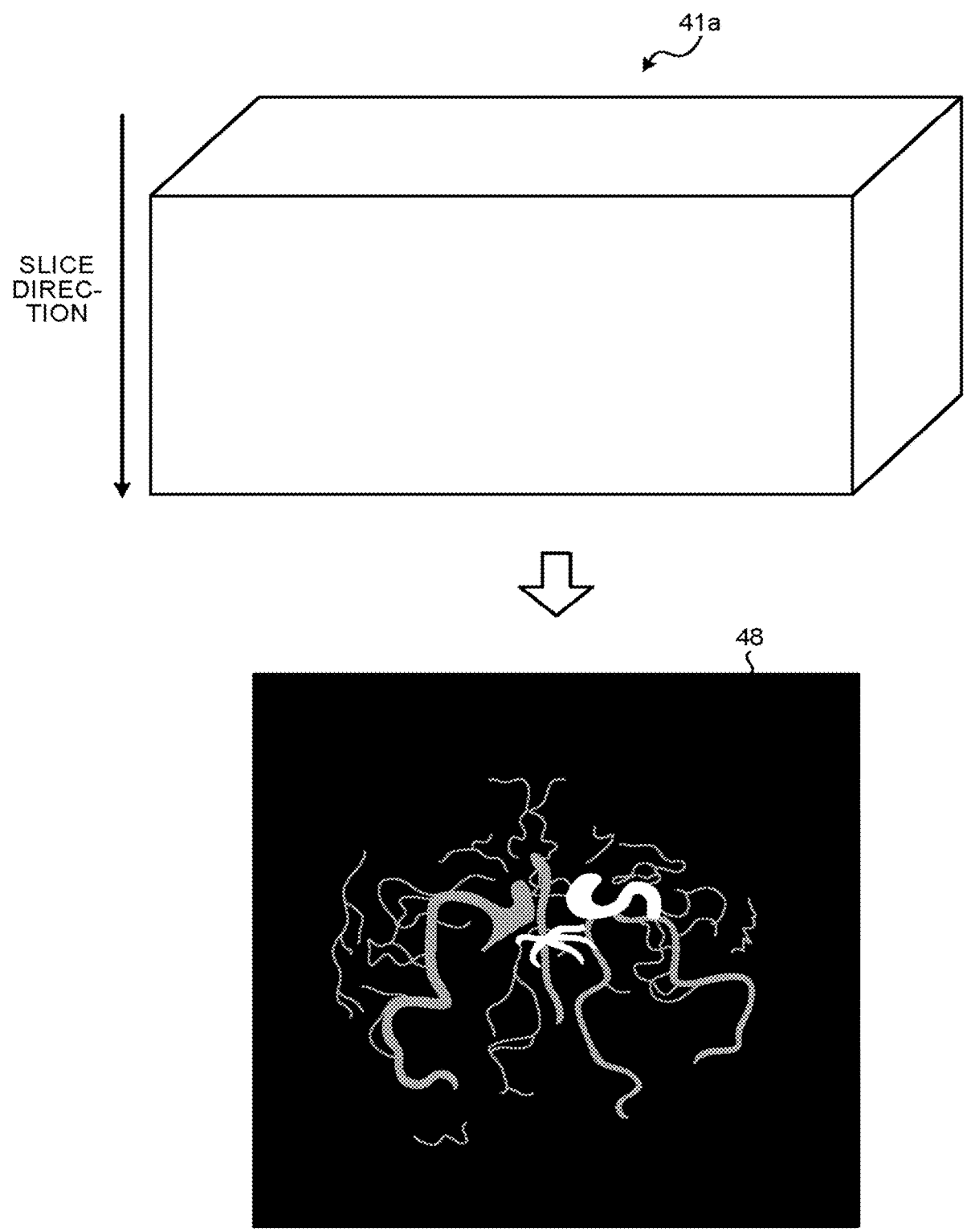
FIG. 12 is a drawing illustrating an example of a 2D image that corresponds to TI3 and has been generated on the basis of a piece of 2D data at step S105.
Figure 13:
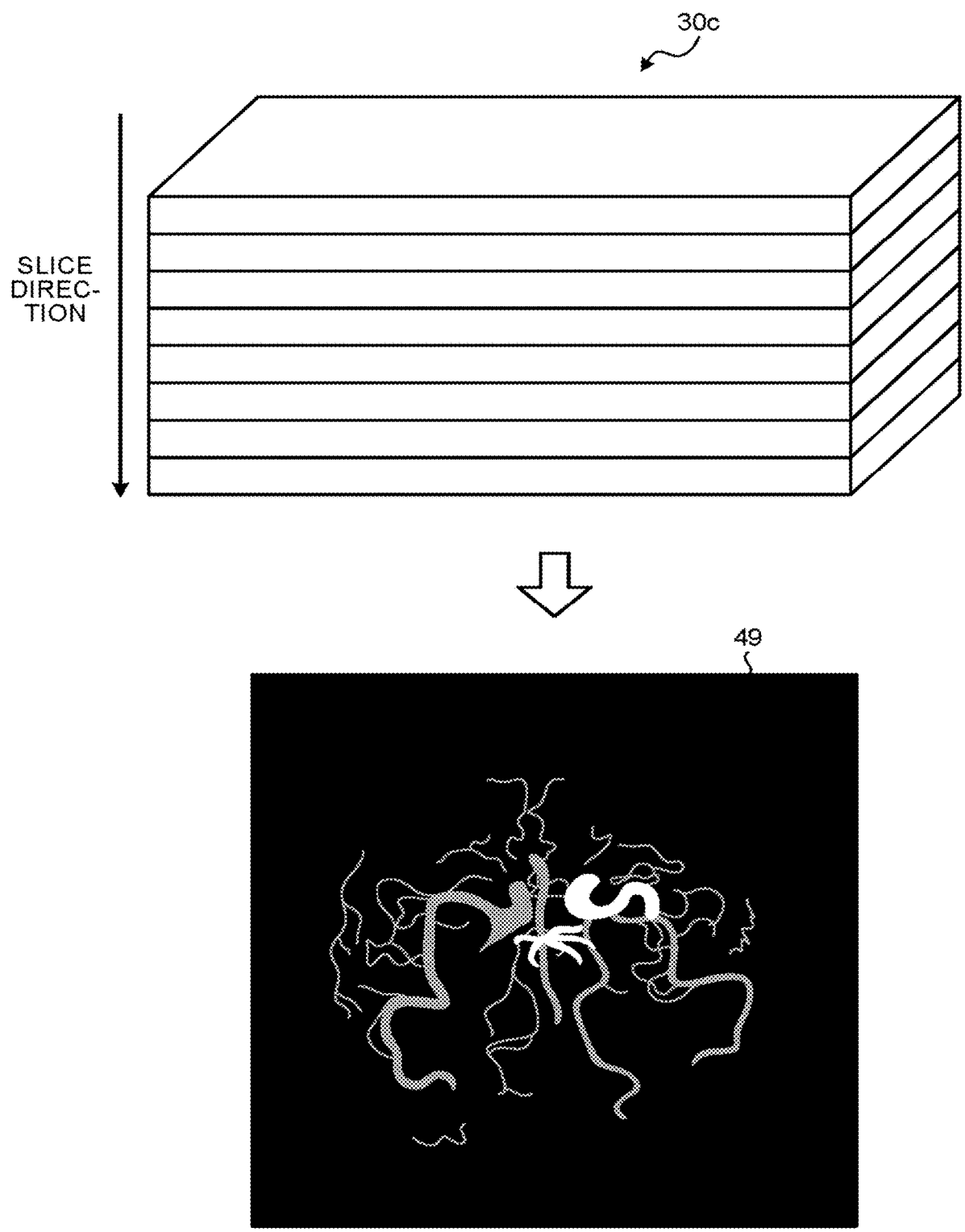
FIG. 13 is a drawing of an example of a 3D image that has been generated on the basis of a piece of 3D data illustrated in FIG. 6 and on which a Maximum Intensity Projection (MIP) process has been performed.

FIG. 12 is a drawing illustrating an example of the 2D image that corresponds to TI3 and has been generated on the basis of the piece of 2D data 41a at step S105. The example in FIG. 12 illustrates a 2D image 42 generated on the basis of the piece of 2D data 41a. In the following sections, an example of the MIP-processed 3D image will be explained by using the situation where, although not at step S105, a 3D image is generated on the basis of the piece of 3D data 30c illustrated in FIG. 6 explained above and an MIP process is performed on the generated 3D image. FIG. 13 is a drawing of an example of the 3D image that has been generated on the basis of the piece of 3D data 30c illustrated in FIG. 6 and on which an MIP process has been performed. The example in FIG. 13 illustrates a 3D image 49 generated on the basis of the piece of 3D data 30c and on which the MIP process has been performed.

When the 2D image 48 illustrated in FIG. 12 is compared with the 3D image 49 illustrated in FIG. 13, it is safe to say that the 2D Image 48 and the 3D image 49 are images equivalent to each other. In the display of the moving picture described above, although some 2D images and some MIP-processed 3D images are both present in a mixed manner, because the 2D images and the MIP-processed 3D images are images equivalent to each other as mentioned above, it is possible to suppress the strange feeling that may be experienced by the operator while viewing (referencing) the display of the moving picture.

The MRI apparatus 100 according to the embodiment has thus been explained. As explained above, by using the MRI apparatus 100, it is possible to improve the time resolution during the data acquiring processes, while preventing the acquisition period as a whole from becoming longer and preventing the S/N ratio of the obtained images from being degraded. In other words, the MRI apparatus 100 according to the present embodiment is able to achieve a high level of convenience.

In the embodiment described shove, the example is explained in which, at step S202, the MRI apparatus 100 replaces the identified 3D sequence with the 2D sequence in which the slice thickness corresponding to the slab thickness set in the identified 3D sequence is set as an image taking condition. In this situation, the data acquired by using the 2D sequence corresponds to data acquired by using a 3D sequence in which the number of slice encoding processes is set to "1" as an image taking condition. For this reason, at step S202, instead of replacing the 3D sequence with the 2D sequence, the MRI apparatus 100 may set the number of slice encoding processes to "1" in the 3D sequence. After that, the MRI apparatus 100 may perform the same processes as described above, as the processes thereafter.

Further, in the embodiment described above, the example is explained in which the MRI apparatus 100 acquires the data by implementing the image taking method called the Single-Tag/Multi-TI (ST-MI) method by which a data acquiring process is performed in correspondence with each of the plurality of TI periods after one tag pulse is applied. However, the MRI apparatus 100 may acquire the data by implementing an image taking method called a Single-Tag/Single-TI (ST-SI) method by which a data acquiring process to acquire data when a predetermined TI period has elapsed since the application of one tag pulse is performed multiple times while varying the TI period.

Further, at at least one time among the twenty times instead of each of the twenty times, the executing function 13a may acquire, by using a 2D sequence, the data allocated to the one time, out of the slice of 2D data corresponding to the entirety of the piece of 3D data 30c, during the data acquiring processes 40a to 40d. In the following sections, an example will be explained in which the executing function 13a acquires the slice of 2D data corresponding to the entirety of the piece of 3D data 30c at only one time among the twenty times. In that situation, because the executing function 13a acquires the slice of 2D data corresponding to the entirety of the piece of 3D data 30c at one time, the acquisition period of the 2D data at the one time is 400 ms. For this reason, although the time resolution is not improved, it is possible to display a moving picture that is able to suppress the strange feeling that may be experienced by the operator while viewing (referencing) the display of the moving picture, for the same reason as explained above. In that situation, the MRI apparatus 100 is able to achieve a high level of convenience.

Further, at each of at least two times among the twenty times instead of each of the twenty times, the executing function 13a may acquire, by using a 2D sequence, the data allocated to the one time, out of the slice of 2D data corresponding to the entirety of the piece of 3D data 30c. As a result, it is possible to improve the time resolution during the data acquiring processes, while preventing the acquisition period as a whole from becoming longer and preventing the S/N ratio of the obtained images from being degraded. In other words, the MRI apparatus 100 according to the present embodiment is able to achieve a high level of convenience.

Further, in the embodiment described above, the example is explained in which the processing circuitry 13 including the executing function 13a, the processing circuitry 14 including the image generating function 14a, and the processing circuitry 15 including the setting function 15a, the generating function 15b, and the display controlling function 15c are configured s separate processing circuitry. However, another arrangement is also acceptable in which a single processing circuitry includes the executing function 13a and the image generating function 14a, as well as the setting function 15a, the generating function 15b, and the display controlling function 15c.

A. First Modification Example of the Embodiment

Alternatively, the MRI apparatus 100 described above may be configured to perform a data acquiring process to acquire pieces of 2D data corresponding to a plurality of cross-sectional planes by using a 2D sequence replacing the 3D sequence. Thus, such an embodiment will be explained as a first modification example of the embodiment. In the description of the first modification example, some of the configurations and the processes that are the same as those in the embodiment described above will be referred to by using the same reference characters, and the explanation thereof will be omitted.

Figure 14:
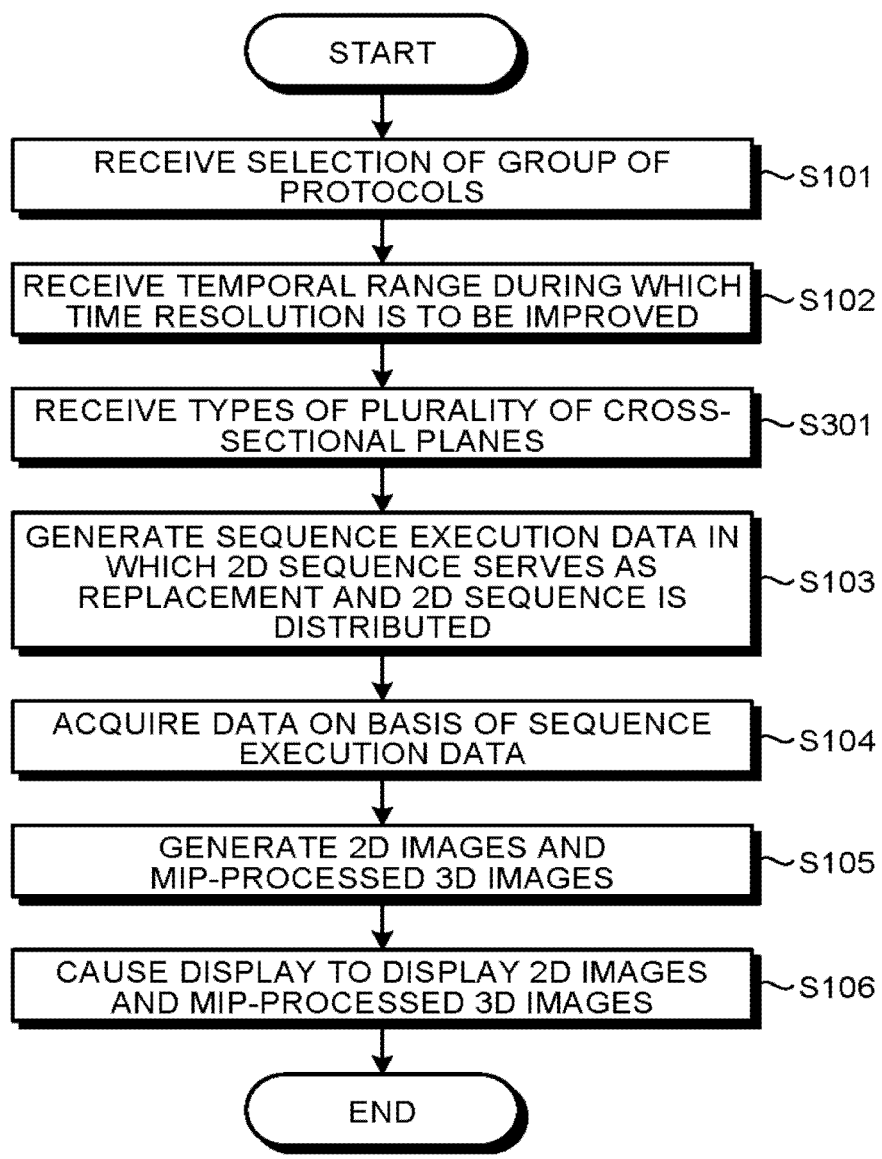
FIG. 14 is a flowchart illustrating a processing procedure according to a first modification example.

FIG. 14 a flowchart illustrating a processing procedure according to the first modification example. As illustrated in the example in FIG. 14, when having executed the process at step S102, the generating function 15b receives, from the operator via the input circuitry 9, one or more types of a plurality of cross-sectional planes from which the 2D data is to be acquired, by using the 2D sequence replacing the 3D sequence (step S301). After that, the generating function 15b proceeds to step S103.

Examples of the types of the cross-sectional planes received at step S301 include body-axis transversal cross-sectional planes (axial cross-sectional planes), sagittal cross-sectional planes, coronal cross-sectional planes, and oblique cross-sectional planes. However, possible types of the cross-sectional planes are not limited to these examples.

After that, at steps S202 and S203 illustrated in FIG. 8 according to the first modification example, the generating function 15b performs the following processes: First, the generating function 15b identifies the number of types of cross-sectional planes received at step S301. For example, when two types of cross-sectional planes such as body-axis transversal cross-sectional planes and coronal cross-sectional planes are received at step S301, the generating function 15b identifies "2" as the number of types of the cross-sectional planes.

Further, the generating function 15b calculates the data acquisition amount of the cross-sectional data to be acquired during a data acquiring process performed at one time, by dividing the data acquisition amount of the data corresponding to one slice encoding process for the 3D data acquired by using the 3D sequence by the number of slice encoding processes for the 3D data and further multiplying the quotient by the identified number of types of the cross-sectional planes. For example, the generating function 15b calculates "a data acquisition amount corresponding to the duration of 20 ms", by dividing the data acquisition amount of the data corresponding to one slice encoding process (i.e., "the data acquisition amount corresponding to the duration of 400 ms") by the number of slice encoding processes "20". Further, by multiplying "the data acquisition amount corresponding to the duration of 20 ms" by the identified number of types of the cross-sectional planes (i.e., "2"), the generating function 15b calculates "a data amount corresponding to the duration of 40 ms", as the data amount of the data to be acquired during the data acquiring process performed at each time, by using the 2D sequence to acquire the pieces of 2D data from the cross-sectional planes (the body-axis transversal cross-sectional planes and the coronal cross-sectional planes).

Further, the generating function 15b calculates the number of shots for each of the different types of cross-sectional planes, by dividing the number of slice encoding processes by the identified number of types of the cross-sectional planes. For example, the generating function 15b calculates the number of shots as "10", by dividing the number of slice encoding processes "20" by the identified number of types of the cross-sectional planes "2". The value "10" denotes the number of sets for the data acquiring processes to acquire the pieces of data from the body-axis cross-sectional planes and also denotes the number of sets for the data acquiring processes to acquire the pieces of data from the coronal cross-sectional planes.

Further, the generating function 15b assigns a 2D sequence to each of the groups having the calculated number of sets. For example, because the number of slice encoding processes for the 3D data is "20", the total number of sets is also "20". In that situation, the generating function 15b changes relevant protocols among the group of protocols received at step S101, so that pieces of 2D data on the body-axis transversal cross-sectional planes are acquired in a data amount corresponding to 40 ms, during the data acquiring processes at each time, within the "10" sets in the former half of the total number of sets (i.e., the "20" sets). Further, the generating function 15b changes relevant protocols among the group of protocols received at step S101, so that pieces of 2D data on the coronal cross-sectional planes are acquired in a data amount corresponding to 40 ms, during the data acquiring processes at each time, within the "10" sets in the latter half.

Figure 15:
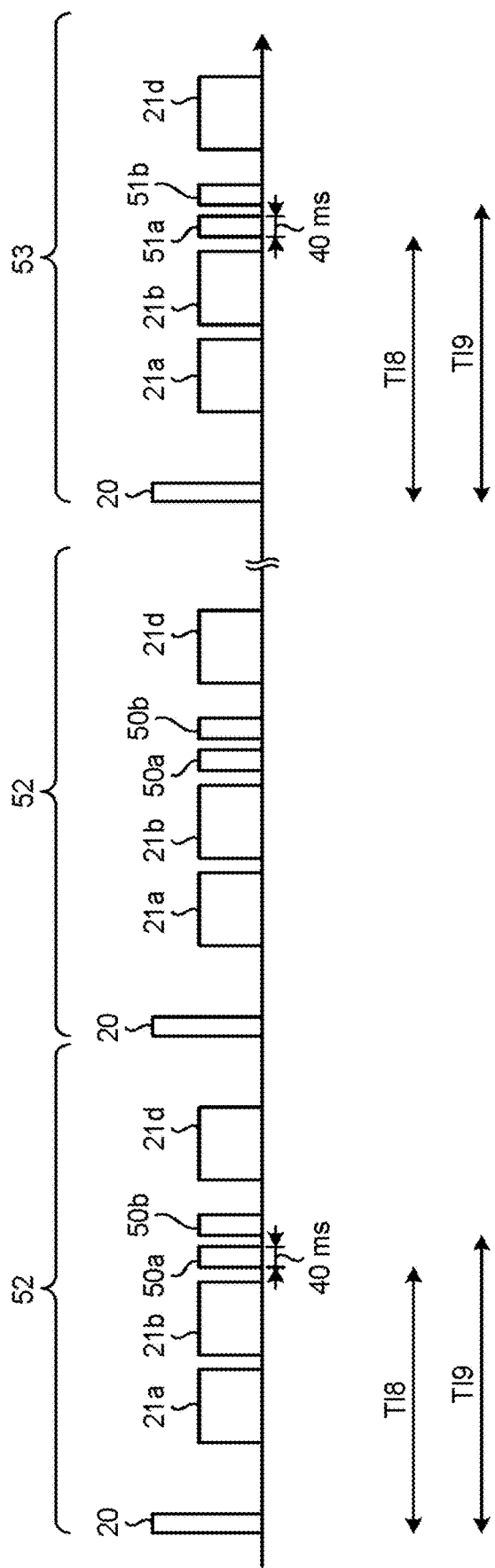
FIG. 15 is a chart for explaining an example in which a generating function according to the first modification example distributes a data acquisition amount of a 2D sequence.

FIG. 15 is a chart for explaining an example in which the generating function 15b according to the first modification example distributes the data acquisition amount of a 2D sequence. FIG. 15 illustrates examples of timing with which tag pulses are applied and timing with which data is acquired in an entire image taking process when the 3D sequence for the data acquiring process 21c illustrated in FIG. 21 is replaced with a 2D sequence, according to the first modification example.

In the explanation provided with reference to FIG. 15, some of the elements that are the same as those in the explanation provided above with reference to FIGS. 2 to 4, 9, and 10 will be referred to by using the same reference characters, and the explanation thereof will be omitted. As illustrated in FIG. 15, the generating function 15b changes a relevant protocol among the group of protocols received at step S101, so that a data acquiring process 50a is performed to acquire 2D data on a body-axis transversal cross-sectional plane in a data amount corresponding to 40 ms, at the time when "TI8" has elapsed as a TI, since the tag pulse 20 for the first time is applied to the labeled region 23. Further, the generating function 15b changes a relevant protocol among the group of protocols received at step S101, so that a data acquiring process 50b is performed to acquire 2D data on a body-axis transversal cross-sectional plane in a data amount corresponding to 40 ms, at the time when "TI9" has elapsed as a TI, since the tag pulse 20 for the first time is applied to the labeled region 23. In addition, the generating function 15b changes relevant protocols among the group of protocols received at step S101, so that a data acquiring process 50a is similarly performed to acquire 2D data on a body-axis transversal cross-sectional plane in a data amount corresponding to 40 ms, at each of the times when "TI8" has elapsed as a TI since the tag pulses 20 for the second to the tenth times are applied. Furthermore, the generating function 15b changes relevant protocols among the group of protocols received at step S101, so that a data acquiring process 50b is similarly performed to acquire 2D data on a body-axis transversal cross-sectional plane in a data amount corresponding to 40 ms, at each of the times when "TI9" has elapsed as a TI since the tag pulses 20 for the second to the tenth times are applied.

Further, as illustrated in FIG. 15, the generating function 15b changes a relevant protocol among the group of protocols received at step S101, so that a data acquiring process 51a is performed to acquire 2D data on a coronal cross-sectional plane in a data amount corresponding to 40 ms, at the time when "TI8" has elapsed as a TI, since the tag pulse 20 for the eleventh time is applied to the labeled region 23. Further, the generating function 15b changes a relevant protocol among the group of protocols received at step S101, so that a data acquiring process 51b is performed to acquire 2D data on a coronal cross-sectional plane in a data amount corresponding to 40 ms, at the time when "TI9" has elapsed as a TI, since the tag pulse 20 for the eleventh time is applied to the labeled region 23. In addition, the generating function 15b changes relevant protocols among the group of protocols received at step S101, so that a data acquiring process 51a is similarly performed to acquire 2D data on a coronal cross-sectional plane in a data amount corresponding to 40 ms, at each of the times when "TI8" has elapsed as a TI since the tag pulses 20 for the twelfth to the twentieth times are applied. Furthermore, the generating function 15b changes relevant, protocols among the group of protocols received at step S101, so that a data acquiring process 51b is similarly performed to acquire 2D data on a coronal cross-sectional plane in a data amount corresponding to 40 ms, at each of the times when "TI9" has elapsed as a TI since the tag pulses 20 for the twelfth to the twentieth times are applied.

In this situation, when the MRI apparatus 100 according to the first modification example is used, as illustrated in FIG. 15, the acquisition period of each of the data acquiring processes 50a, 50b, 51a, and 51b is 40 ms. Accordingly, during the temporal range designated by the operator, the interval between two adjacent TI periods is reduced from 400 ms to the minimum of 40 ms, and it is therefore possible to shorten the intervals between the TI periods. Consequently, by using the MRI apparatus 100 according to the first modification example, it is possible to improve the time resolution during the data acquiring processes. Further, in the example illustrated in FIG. 15, during the temporal range designated by the operator, two pieces of 2D data are acquired to generate two images, for each cross-sectional image. In other words, during the temporal range designated by the operator, while one image is generated when the data acquiring processes are performed as illustrated in the example in FIG. 4, two images are generated for each cross-sectional image when the data acquiring processes are performed as illustrated in the example in FIG. 15. Consequently, because the time resolution during the data acquiring processes is improved, it is possible to improve the time resolution during the display of the moving picture.

Further, because the number of slice encoding processes is "20" in the present example, as illustrated in FIG. 15, a set 52 made up of the application of the tag pulse 20 as well as the data acquiring processes 21a, 21b, and 21d, and the data acquiring processes 50a and 50b is repeatedly performed ten times. A set 53 made up of the application of the tag pulse 20 as well as the data acquiring processes 21a, 21b, and 21d, and the data acquiring processes 51a and 51b is repeatedly performed ten times. In contrast, according to the pre-change group of protocols received at step S101, the set 17 made up of the application of the tag pulse 20 and the data acquiring processes 21a to 21d is repeatedly performed twenty times, as illustrated in FIG. 2 explained above. Thus, the number of times the set is performed is unchanged between the pre-change group of protocols and the group of protocols including the changed protocols. Further, the shot interval is unchanged between the pre-change group of protocols and the group of protocols including the changed protocols. Thus, the acquisition period as a whole is unchanged between the pre-change group of protocols and the group of protocols including the changed protocols. Consequently, by using the MRI apparatus 100 according to the first modification example, it is possible to prevent the acquisition period as a whole from becoming longer.

Further, when the MRI apparatus 100 according to the first modification example is used, there is no need to raise the multiple speed ratio even when a parallel imaging process is performed, and it is therefore not necessary to change the multiple speed ratio. Accordingly, when the MRI apparatus 100 according to the first modification example is used, the S/N ratio of the obtained images is not degraded. Consequently, by using the MRI apparatus 100 according to the first modification example, it is possible to prevent the S/N ratio of the obtained images from being degraded. It means that, by using the MRI apparatus 100 according to the first modification example, it is possible to prevent the quality of the obtained images from being degraded.

As explained above, by using the MRI apparatus 100 according to the first modification example, it is possible to improve the time resolution during the data acquiring processes while preventing the acquisition period as a whole from becoming longer and preventing the S/N ratio of the obtained images from being degraded. In other words, the MRI apparatus 100 according to the first modification example is able to achieve a high level of convenience.

Further, the generating function 15b generates the sequence execution data on the basis of the group of protocols including the changed protocols. After that, the generating function 15b transmits the generated sequence execution data to the executing function 13a.

At step S104 according to the first modification example, when having received the sequence execution data transmitted thereto by the generating function 15b, the executing function 13a acquires data by performing the processes described below on the basis of the sequence execution data. Because the data acquiring processes 21a, 21b, and 21d are the same as those described in the embodiment above, the explanation thereof will be omitted. For example, the executing function 13a applies the tag pulse 20 to the labeled region 23 twenty times at predetermined shot intervals. Further, the executing function 13a performs the data acquiring process 50a at the time when "TI8" has elapsed as a TI, since each of the tag pulses 20 at the first to the tenth times is applied. Further, the executing function 13a performs the data acquiring process 50b at the time when "TI9" has elapsed as a TI, since each of the tag pulses 20 for the first to the tenth times is applied.

In addition, the executing function 13a performs the data acquiring process 51a at the time when "TI8" has elapsed as a TI, since each of the tag pulses 20 at the eleventh to the twentieth times is applied. Further, the executing function 13a performs the data acquiring process 51b at the time when "TI9" has elapsed as a TI, since each of the tag pulses 20 for the eleventh to the twentieth times is applied.

Consequently, when the MRI apparatus 100 according to the first modification example is used, it is possible to acquire the 2D data on each of the plurality of cross-sectional images taken on the mutually-different cross-sectional planes, by adjusting the data amount of the data acquired during the data acquiring process performed at each of the times to "the data amount corresponding to the duration of 40 ms". Accordingly, by using the MRI apparatus 100 according to the first modification example, it is possible to generate the 2D image corresponding to each of the plurality of cross-sectional images.

Further, by using the MRI apparatus 100 according to the first modification example, similarly to the embodiment described above, it is possible to improve the time resolution during the data acquiring processes while preventing the acquisition period as a whole from becoming longer and preventing the S/N ratio indicating the image quality of the obtained images from being degraded. Consequently, the MRI apparatus 100 according to the first modification example is able to achieve a high level of convenience.

A Second Modification Example of the Embodiment

In the embodiment and the first modification example described above, the examples are explained in which the MRI apparatus 100 performs the data acquiring processes in the tag mode; however, possible configurations of the MRI apparatus 100 are not limited to these examples. For instance, the MRI apparatus 100 may perform data acquiring processes in a control mode by which, in addition to the data acquiring processes in the tag mode, data is acquired with predetermined timing after a control pulse similar to the tag pulse is applied to a position having no influence on the fluid. Further, the MRI apparatus 100 may generate difference images indicating the differences between the images generated from the data acquired during the data acquiring processes in the tag made and the images generated from the data acquired during the data acquiring processes in the control mode, as images in which background signals are suppressed. Thus, such an embodiment will be explained as a second modification example of the embodiment.

Because the "3D images" and the "2D images" generated in the embodiment described above and the first modification example are images generated on the basis of the data acquired during the data acquiring processes in the tag mode, the "3D images" and the "2D images" will be referred to as "3D tag images" and "2D tag images" in the description of the second modification example. Further, in the description of the second modification example, some of the configurations and the processes that are the same as those in the embodiment described above and the first modification example will be referred to by using the same reference characters, and the explanation thereof will be omitted.

Figure 16:
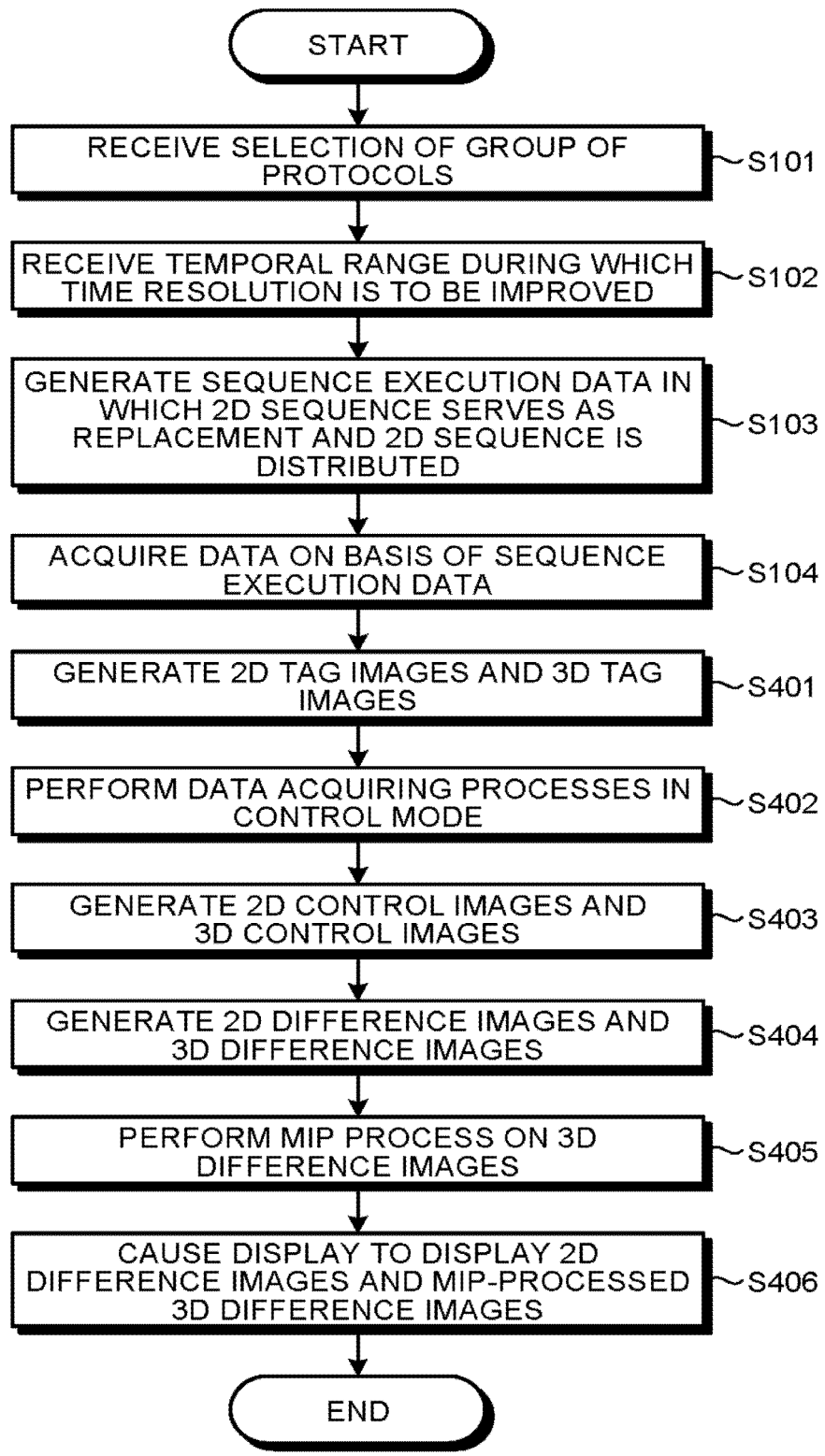
FIG. 16 is a flowchart illustrating a processing procedure according to a second modification example.

FIG. 16 is a flowchart illustrating a processing procedure according to the second modification example. In the present example, at step S103, the generating function 15*b* according to the second modification example performs the following processes, in addition to the process described above performed at step S103 by the generating function 15*b* according to the embodiment above: The generating function 15*b* according to the second modification example replaces the 3D sequence for the data acquiring processes in the control mode performed in the temporal range during which the time resolution is improved, with a 2D sequence which is used for acquiring 2D data and in which a slice thickness corresponding to the slab thickness set in the 3D sequence as an image taking condition is set as an image taking condition. Further, at step S103, the generating function 15*b* generates sequence execution data in which the replacing 2D sequence is distributed among the data acquiring processes that are repeatedly performed as many times as the number of slice encoding processes. After that, at step S103, the generating function 15*b* transmits the generated sequence execution data to the executing function 13*a*.

Figure 17:
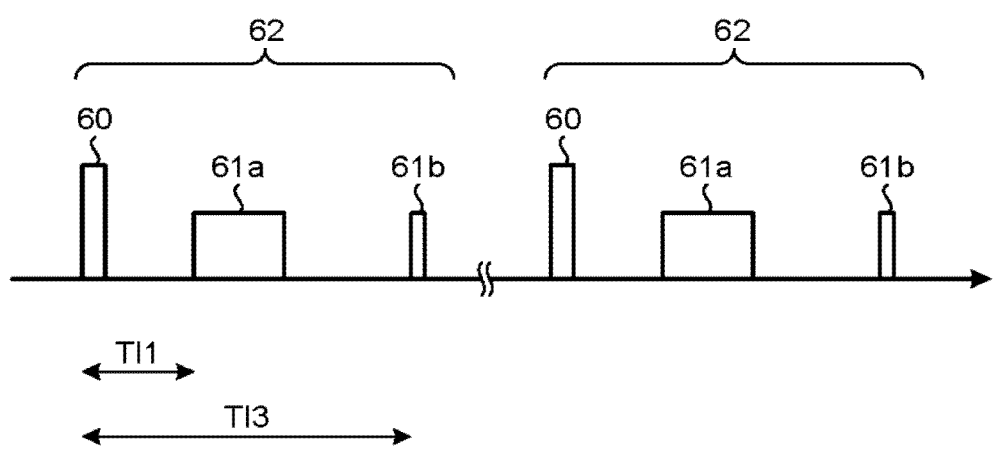
FIG. 17 is a chart illustrating examples of timing with which control pulses are applied and timing with which data is acquired in an entire image taking process in a situation where, at step S103, a 3D sequence for data acquiring processes in a control mode is replaced with a 2D sequence, and the 2D sequence is distributed.

FIG. 17 is a chart illustrating examples of timing with which control pulses are applied and timing with which data is acquired in an entire image taking process in the situation where, at step S103, the 3D sequence for the data acquiring processes in the control mode is replaced with the 2D sequence, and the 2D sequence is distributed.

As illustrated in the example in FIG. 17, the generating function 15*b* changes a relevant protocol among the group of protocols received at step S101, so that a data acquiring process 61*a* equivalent to the data acquiring process 21*a* described above is performed at the time when "TI1" has elapsed as a TI, since a control pulse 60 equivalent to the tag pulse 20 is applied to a position having no influence on the fluid. Further, the generating function 15*h* changes a relevant protocol, so that a data acquiring process 61*b* equivalent to the data acquiring process 40*a* described above is performed at the time when "TI3" has elapsed as a TI, since the control pulse 60 is applied.

The time at which the data acquiring process 61*a* is performed does not necessarily have to be the time when "TI1" has elapsed since the control pulse 60 is applied. The time at which the data acquiring process 61*a* is performed may be the time when an arbitrary waiting period has elapsed since the control pulse 60 is applied. Similarly, the time at which the data acquiring process 61*b* is performed does not necessarily have to be the time when "TI3" has elapsed since the control pulse 60 is applied. The time at which the data acquiring process 61*b* is performed may be the time when an arbitrary waiting period has elapsed since the control pulse 60 is applied.

In the present example, because the number of slice encoding processes is "20", as illustrated in FIG. 17, a set made up of the application of the control pulse 60 and the data acquiring processes 61*a* and 61*b* is repeatedly performed twenty times.

Further, on the basis of the group of protocols including the changed protocols, the generating function 15*b* generates sequence execution data. After that, the generating function 15*b* transmits the generated sequence execution data to the executing function 13*a*. The process performed at step S103 according to the second modification example has thus been explained.

As explained above, at step S203 (S103) according to the second modification example, the generating function 15*b* generates the sequence execution data by which the executing function 13*a* performs the data acquiring processes 61*a* and 61*b* the predetermined number of times (twenty times) to acquire the pieces of data after applying the control pulse 60 to the position having no influence on the fluid flowing into the image taking region 22 of the patient S.

At step S203 (S103) according to the second modification example, when the executing function 13*a* performs the data acquiring processes 61*a* and 61*b*, the generating function 15*b* generates the sequence execution data to acquire the three-dimensional data used for generating three-dimensional control images by acquiring the data corresponding to one slice encoding process at each of the twenty times, during the data acquiring process 61*a*. Further, when the executing function 13*a* performs the data acquiring processes 61*a* and 61*b*, the generating function 15*b* generates the sequence execution data to acquire the two-dimensional data used for generating two-dimensional control images by distributing the data acquisition of the data corresponding to one slice encoding process among the twenty times, during the data acquiring process 61*b*. After that, the generating function 15*b* transmits the generated sequence execution data to the executing function 13*a*.

Returning to the description of FIG. 16, when the process at step S104 has been performed, the image generating function 14*a* performs the following processes at step S401: Similarly to the process described in the embodiment above and the first modification example, the image generating function 14*a* generates a 3D tag image corresponding to TI1 on the basis of the piece of 3D data 30*a*. Further, the image generating function 14*a* generates a 3D tag image corresponding to TI2 on the basis of the piece of 3D data 30*b*.

Also, the image generating function 14a generates a 3D tag image corresponding to TI4 on the basis of the piece of 3D data 30d.

Further, the image generating function 14a generates a 2D tag image corresponding to TI3 on the basis of the piece of 2D data 41a. Also, the image generating function 14a generates a 2D tag image corresponding to TI5 on the basis of the piece of 2D data 41b. In addition, the image generating function 14a generates a 2D tag image corresponding to TI6 on the basis of the piece of 2D data 41c. Furthermore, the image generating function 14a generates a 2D tag image corresponding to TI6 on the basis of the piece of 2D data 41d (step S401).

After that, the executing function 13a executes the data acquiring processes in the control mode (step S402). At step S402, the executing function 13a performs the following processes on the basis of the sequence execution data: The executing function 13a applies the control pulses 60 to a position having no influence to the fluid twenty times at predetermined shot intervals. Further, the executing function 13a performs a data acquiring process 61a at the time when "TI1" has elapsed as a TI since each of the control pulses 60 is applied. Further, the executing function 13a performs a data acquiring process 61b at the time when "TI3" has elapsed as a TI, since each of the control pulses 60 is applied.

As explained above, the MRI apparatus 100 according to the second modification example performs, at step S402 the data acquiring processes in the control mode in which the pieces of data are acquired at the predetermined times after each of the control pulses is applied to the position having no influence on the fluid.

As explained above, at step S402, the executing function 13a performs the data acquiring processes 61a and 61b the predetermined number of times (twenty times) to acquire the pieces of data after each of the control pulses 60 is applied to the position having no influence on the fluid flowing into the image taking region 22 of the patient S. Further, when performing the data acquiring processes 61a and 61b twenty times, the executing function 13a acquires, during the data acquiring process 61a, the three-dimensional data used for generating the three-dimensional control images by acquiring the data corresponding to one slice encoding process at each of the twenty times. In other words, at each of the twenty times, the executing function 13a acquires, by using the 3D sequence, the data corresponding to one region, out of the three-dimensional data that is used for generating the three-dimensional control images and is acquired while being divided into the plurality of regions. Further, when performing the data acquiring processes 61a and 61b twenty times, the executing function 13a acquires, during the data acquiring process 61b, the two-dimensional data used for generating the two-dimensional control images by distributing the data acquisition of the data corresponding to one slice encoding process among the twenty times. In other words, at each of the twenty times, the executing function 13a acquires, by using the 2D sequence, the piece of data allocated to the one time, out of the slice of two-dimensional data that is used for generating the two-dimensional control images and that corresponds to the entirety of the three-dimensional data used for generating the three-dimensional control images. In this situation, the data acquiring process 61a is an example of a third data acquiring process. Further, the data acquiring process 61b is an example of a fourth data acquiring process. The data corresponding to one slice encoding process acquired at each of the data acquiring processes 61a performed twenty times is an example of third data.

In this situation, at at least one time among the twenty times, the executing function 13a may acquire, by using the 3D sequence, the data corresponding to one region, out of the three-dimensional data that is used for generating the three-dimensional control images and is acquired while being divided into the plurality of regions. Further, at at least one time among the twenty times, the executing function 13a may acquire, by using the 2D sequence, the piece of data allocated to the one time, out of the slice of two-dimensional data that is used for generating the two-dimensional control images and that corresponds to the entirety of the three-dimensional data used for generating the three-dimensional control images.

The MRI apparatus 100 according to the second modification example may perform step S401 after performing step S402.

Further, the image generating function 14a generates the 2D control images and the 3D control images on the basis of the pieces of data acquired during the data acquiring processes in the control mode (step S403).

For example, the image generating function 14a generates 3D control images on the basis of the pieces of 3D data acquired during the data acquiring process 61a performed twenty times. Further, the image generating function 14a generates 2D control images on the basis of the pieces of 2D data acquired during the data acquiring process 61b performed twenty times. Alternatively, the MRI apparatus 100 according to the second modification example may perform steps S104 and S401, after performing steps S402 and S403.

Further, the image generating function 14a generates 2D difference images and 3D difference images (step S404). For example, the image generating function 14a generates a 3D difference image indicating the difference between the 3D tag image corresponding to TI1 and the 3D control image. Further, the image generating function 14a generates a 3D difference image indicating the difference between the 3D tag image corresponding to TI2 and the 3D control image. Also, the image generating function 14a generates a 3D difference image indicating the difference between the 3D tag image corresponding to TI4 and the 3D control image.

Further, the image generating function 14a generates a 2D difference image indicating the difference between the 2D tag image corresponding to TI3 and the 2D control image. Also, the image generating function 14a generates a 2D difference image indicating the difference between the 2D tag image corresponding to TI5 and the 2D control image. In addition, the image generating function 14a generates a 2D difference image indicating the difference between the 2D tag image corresponding to TI6 and the 2D control image. Furthermore, the image generating function 14a generates a 2D difference image indicating the difference between the 2D tag image corresponding to TI7 and the 2D control image.

Subsequently, the executing function 13a performs an MIP process on the 3D difference images generated at step S404 (step S405).

After that, the display controlling function 15c causes the display 10 to display the 2D difference images generated at step S404 and the 3D difference images on which the MIP process was performed at step S405 (step S406) and ends the process. As a result, the display 10 displays the images in which the background signals are suppressed.

For example, at step S406, the display controlling function 15c causes the display 10 to display either one of the 2D difference images or one of the MIP-processed 3D images in correspondence with each of the TI periods. As a result, the display 10 displays a moving picture by serially displaying, in a time series, the images indicating the state of the fluid such as the blood or the cerebrospinal fluid of the patient in correspondence with the TI periods. In a specific example, the display controlling function 15c at first causes the MIP-processed 3D difference image corresponding to TI1 to be displayed. Subsequently, the display controlling function 15c causes the MIP-processed 3D difference image corresponding to TI2 to be displayed. After that, the display controlling function 15c causes the 2D difference image corresponding to TI3 to be displayed. Subsequently, the display controlling function 15c causes the 2D difference image corresponding to TI5 to be displayed. After that, the display controlling function 15c causes the 2D difference image corresponding to TI6 to be displayed. Subsequently, the display controlling function 15c causes the 2D difference image corresponding to TI7 to be displayed. After that, the display controlling function 15c causes the MIP-processed 3D difference image corresponding to TI4 to be displayed.

The MRI apparatus 100 according to the second modification example has thus been explained. When the MRI apparatus 100 according to the second modification example is used, because the images in which the background signals are suppressed are displayed, it is possible to display images from which the operator is able to easily understand the state of the fluid.

Further, by using the MRI apparatus 100 according to the second modification example, it is possible, similarly to the embodiment described above, to improve the time resolution during the data acquiring processes, while preventing the acquisition period as a whole from becoming longer and preventing the S/N ratio of the obtained images from being degraded. In other words, the MRI apparatus 100 according to the second modification example is able to achieve a high level of convenience.

A Third Modification Example of the Embodiment

The MRI apparatus 100 may realize a display that prompts the operator to determine a temporal range during which the time resolution is to be improved. Thus, such an embodiment will be explained as a third modification example of the embodiment. In the description of the third modification example, some of the configurations and the processes that are the same as those in the embodiment described above and the first and the second modification examples will be referred to by using the same reference characters, and the explanation thereof will be omitted.

FIG. 18 is a flowchart illustrating a processing procedure according to the third modification example. For instance, at step S101 according to the third modification example, the setting function 15a receives, from the operator via the input circuitry 9, a group of protocols used for implementing the 3D Dynamic ASL MRA method explained above with reference to FIGS. 2 to 6 as a main scan. In addition, at step S101 according to the third modification example, the setting function 15a also receives, from the operator via the input circuitry 9, a group of protocols used for implementing the 3D Dynamic ASL MRA method, as a pre-scan. Alternatively, the setting function 15a may receive a group of protocols used for acquiring 2D data, as a pre-scan.

In the group of protocols that was received as the pre-scan and is used for implementing the 3D dynamic ASL MRA method, the PE Matrix value and the slice encoding value are thinned out, compared to the group of protocols used for implementing the 3D dynamic ASL MRA method as the main scan. For this reason, although the quality of the images generated on the basis of the data acquired during the data acquiring processes in the pre-scan is not higher than the quality of the images generated on the basis of the data acquired during the data acquiring processes in the main scan, the acquisition period of the data acquiring processes in the pre-scan is shorter than the acquisition period of the data acquiring processes in the main scan.

As illustrated in FIG. 18, subsequent to step S101, the executing function 13a performs the pre-scan (step S501).

For instance, an example will be explained in which a group of protocols used for implementing the 3D Dynamic ASL MRA method as the pre-scan is received. In that situation, at step S501, the generating function 15b generates sequence execution data on the basis of the group of protocols that was received as the pre-scan and is used for implementing the 3D Dynamic ASL MRA method. After that, the generating function 15b transmits the generated sequence execution data to the executing function 13a. Accordingly, having received the sequence execution data, the executing function 13a acquires data by performing the pre-scan on the basis of the sequence execution data.

Another example will be explained in which a group of protocols used for acquiring 2D data as the pre-scan is received. In that situation, at step S501, the generating function 15b generates sequence execution data on the basis of the group of protocols that was received as the pre-scan and is used for acquiring the 2D data. After that, the generating function 15b transmits the generated sequence execution data to the executing function 13a. Accordingly, having received the sequence execution data, the executing function 13a acquires the 2D data by performing the pre-scan on the basis of the sequence execution data.

After that, the display controlling function 15c causes the display 10 to display the result of the pre-scan (step S502). For example, at step S502, the generating function 15b generates 2D images and 3D images indicating the state of the fluid such as the blood or the cerebrospinal fluid of the patient S corresponding to the TI periods, on the basis of the data acquired during the pre-scan performed at step S501. Further, the display controlling function 15c causes the display 10 to display a moving picture by serially displaying the 2D images and the 3D images in a time series.

As a result, although the quality of the images is not higher than that of the images from the main scan, it is possible to enable the operator to view images in which he/she is able to check the lesion site such as a tumor. Thus, it is possible to enable the operator to determine the temporal range including the time at which the lesion site is checked, as the temporal range during which the time resolution is to be improved. Accordingly, it is possible to enable the operator to easily determine the temporal range during which the time resolution is to be improved. Further, at step S102, the generating function 15b receives, from the operator via the input circuitry 9, the temporal range during which the time resolution is to be improved and which was easily determined by the operator in the manner described above.

After that, at step S104, the executing function 13a performs the data acquiring processes 40a to 40d during the temporal range designated by the operator who has viewed the images displayed on the display 10.

As explained above, the executing function 13a according to the third modification example acquires the data by performing the pre-scan before receiving the designation of the temporal range from the operator, e.g., before performing the data acquiring processes 40a to 40d. After that, before performing the data acquiring processes 40a to 40d, the display controlling function 15c according to the third modification example causes the display 10 to display the images based on the data acquired by performing the pre-scan. Further, the executing function 13a according to the third modification example performs the data acquiring processes 40a to 40d during the temporal range designated by the operator who has viewed the images displayed on the display 10. The data acquired by performing the pre-scan is an example of fifth data.

The MRI apparatus 100 according to the third modification example has thus been explained. By using the MRI apparatus 100 according to the third modification example, it is possible to enable the operator to easily determine the temporal range during which the time resolution is to be improved, as described above.

Further, similarly to the embodiment described above, by using the MRI apparatus 100 according to the third modification example, it is possible to improve the time resolution during the data acquiring processes while preventing the acquisition period as a whole from becoming longer and preventing the S/N ratio indicating the quality of the obtained images from being degraded. In other words, the MRI apparatus 100 according to the third modification example is able to achieve a high level of convenience.

In the embodiment above and the modification examples, the example of the method by which the data in the k-space is acquired by performing a Cartesian sampling process is explained. However, the data in the k-space may be acquired by performing a Non-Cartesian sampling process. Examples of methods that can be used when the data in the k-space is acquired by performing a Non-Cartesian sampling process include a radial acquisition method and a Periodically Rotated Overlapping Parallel Lines with Enhanced Reconstruction (PROPELLER) method.

The radial acquisition method is an acquisition method by which the data is acquired in a radial formation going through the origin in the k-space, while varying the gradient magnetic fields. According to the radial acquisition method, data points on a single k-space locus going through the origin of the k-space are obtained in a TR period, so as to fill acquired data with the data points in the k-space by rotating the k-space locus for each TR. When the radial acquisition method is used, the MRI apparatus 100 performs the same processes as those described above, by dividing the region into segments each corresponding t a predetermined number of k-space loci so that the data corresponding to each of the segments is treated as the data corresponding to one slice encoding process described above.

Further, according to the PROPELLER method, acquired data filled with data points in the k-space by repeatedly performing an acquiring process for each TR while varying the rotation angle of a strip-like rectangular region (called "blade"). The PROPELLER method may also be referred to as a blade method. When the PROPELLER method is used, the MRI apparatus 100 performs the same processes as those described above, by dividing the region into segments each corresponding to a rectangular region having a predetermined rotation angle so that the data corresponding to each of the segments is treated as the data corresponding to one slice encoding process described above.

It is also acceptable to acquire the data in the k-space by implementing a Pointwise Encoding Time Reduction with Radial Acquisition (PETRA) method by which the data in a central part of the k-space is acquired by performing the Cartesian sampling process, whereas the data in the part other than the central part of the k-space is acquired by implementing the radial acquisition method.

Further, the method used for acquiring the 2D data and the method used for acquiring the 3D data does not necessarily have to be the same as each other. For example, a method by which the data in the k-space is acquired in a Cartesian manner may be used as the method for acquiring the 2D data, while a method by which the data in a space is acquired in a non-Cartesian manner may be used as the method for acquiring the 3D data. Conversely, a method by which the data in the k-space is acquired in a non-Cartesian manner may be used as the method for acquiring the 2D data, while a method by which the data in a space is acquired in a Cartesian manner may be used as the method for acquiring the 3D data.

By using the MRI apparatus 100 according to at least one aspect of the embodiments and the modification examples described above, it is possible to improve the time resolution during the data acquiring processes while preventing the acquisition period as a whole from becoming longer and preventing the S/N ratio of the obtained images from being degraded.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
processing circuitry configured to repeatedly execute a pulse sequence a first number of times, the pulse sequence including a tag pulse used for labeling a fluid flowing into an image taking region of a patient followed by a plurality of data acquisition processes, wherein
the processing circuitry acquires during each of a first plurality of the data acquisition processes three-dimensional data corresponding to one region by using a three-dimensional sequence, and
the processing circuitry acquires during each of a second plurality of data acquisition processes two-dimensional data corresponding to the one region by using a two-dimensional sequence,
a first time difference between respective beginning times of the first plurality of data acquisition processes being longer than a second time difference between beginning times of the second plurality of data acquisition processes.

2. The magnetic resonance imaging apparatus according to claim 1, wherein the processing circuitry acquires the two-dimensional data multiple times, during a time period equal to a duration of one of the first plurality of data acquisition processes.

3. The magnetic resonance imaging apparatus according to claim 1, wherein a slice thickness of the two-dimensional data is equal to a thickness corresponding to the three-dimensional data obtained using a plurality of slice encoding.

4. The magnetic resonance imaging apparatus according to claim 1, wherein, the processing circuitry acquires data corresponding to a different one of a plurality of cross-sectional images taken on mutually-different cross-sectional planes during the second plurality of data acquisition processes.

5. The magnetic resonance imaging apparatus according to claim 1, wherein
the processing circuitry further performs a data acquiring process the first number of times by which data is acquired after a control pulse is applied to a position having no influence on the fluid,
the processing circuitry acquires, during one of the first plurality of data acquisition processes, data corresponding to the one region by using a three-dimensional sequence, out of three-dimensional data that is used for generating a three-dimensional control image and is acquired while being divided into a plurality of regions, and
the processing circuitry acquires data allocated to the one of the first plurality of data acquisition processes by using a two-dimensional sequence, out of a slice of two-dimensional data that is used for generating a two-dimensional control image.

6. The magnetic resonance imaging apparatus according to claim 1, wherein
the processing circuitry further generates a two-dimensional image on a basis of the acquired two-dimensional data, generates a three-dimensional image on a basis of the acquired three-dimensional data, and performs a Maximum Intensity Projection (MIP) process on the generated three-dimensional image, and
the processing circuitry causes a display to display the generated two-dimensional image and the three-dimensional image on which the MIP process has been performed.

7. The magnetic resonance imaging apparatus according to claim 1, wherein
the processing circuitry further acquires predetermined data before performing the second plurality of data acquisition processes,
the processing circuitry causes a display to display an image based on the predetermined data before performing the second plurality of data acquisition processes, and
the processing circuitry performs the second plurality of data acquiring processes during a timing range designated by an operator who has referenced the image displayed on the display.

8. The magnetic resonance imaging apparatus according to claim 1, wherein an image taking method by which the data is acquired after the tag pulse is applied is an Arterial Spin Labeling (ASL) method.

9. The magnetic resonance imaging apparatus according to claim 1, comprising the processing circuitry performing another data acquisition process to acquire three dimensional data after performing the second plurality of data acquisition processes.

* * * * *